US010271458B2

United States Patent
Asai et al.

(10) Patent No.: US 10,271,458 B2
(45) Date of Patent: Apr. 23, 2019

(54) COOLING DEVICE, POWER CONVERSION DEVICE, AND COOLING SYSTEM

(71) Applicant: Mitsubishi Electric Corporation, Chiyoda-ku (JP)

(72) Inventors: Yugo Asai, Chiyoda-ku (JP); Shigetoshi Ipposhi, Chiyoda-ku (JP); Masaru Shinozaki, Chiyoda-ku (JP); Hiroyuki Higashino, Chiyoda-ku (JP); Kazuki Sakata, Chiyoda-ku (JP); Masakazu Tani, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 3 days.

(21) Appl. No.: 15/559,843

(22) PCT Filed: Mar. 25, 2015

(86) PCT No.: PCT/JP2015/059168
§ 371 (c)(1),
(2) Date: Sep. 20, 2017

(87) PCT Pub. No.: WO2016/151805
PCT Pub. Date: Sep. 29, 2016

(65) Prior Publication Data
US 2018/0084673 A1 Mar. 22, 2018

(51) Int. Cl.
*H05K 7/20* (2006.01)
*F28D 15/02* (2006.01)

(52) U.S. Cl.
CPC ..... *H05K 7/20327* (2013.01); *F28D 15/0266* (2013.01); *H05K 7/20936* (2013.01)

(58) Field of Classification Search
CPC .. H05K 7/20327; H05K 7/20936; H05K 7/20; H05K 7/20218; H05K 7/20927; H05K 7/20272; F28D 15/0266; H01L 23/473
See application file for complete search history.

(56) References Cited

U.S. PATENT DOCUMENTS 3,524,497 A * 8/1970 Chu ............... H01L 23/473
165/104.33
3,921,201 A * 11/1975 Eisele ............ H01L 23/427
165/80.4
(Continued)

FOREIGN PATENT DOCUMENTS

JP 54-61346 5/1979
JP 9-139453 A 5/1997
(Continued)

OTHER PUBLICATIONS

International Search Report dated Jun. 23, 2015 in PCT/JP2015/059168 filed Mar. 25, 2015.
(Continued)

*Primary Examiner* — James Wu
*Assistant Examiner* — Michael A Matey
(74) *Attorney, Agent, or Firm* — Oblon, McClelland, Maier & Neustadt, L.L.P.

(57) ABSTRACT

Provided is a cooling device, a power conversion device, and a cooling system in which bubbles produced by boiling in the cooling device are inhibited from flowing out of the cooling device, and thus, vibration, noise, and damage to pipes and other components can be prevented. A cooling device according to the present invention includes a housing having a hollow interior, the housing having a refrigerant inlet from which refrigerant flows in and a refrigerant outlet from which the refrigerant flows out, and having, in the hollow interior, a refrigerant flow path through which the refrigerant flows, and an opening body provided in the housing, dividing the refrigerant flow path into a first area including a heating surface being at least one of a bottom surface and side surfaces of the housing and heating the refrigerant, and a second area including the refrigerant outlet, and having a plurality of openings.

13 Claims, 19 Drawing Sheets

(56) References Cited

U.S. PATENT DOCUMENTS

| | | | | |
|---|---|---|---|---|
| 7,035,104 B2* | 4/2006 | Meyer | | F28F 3/12 |
| | | | | 165/104.33 |
| 7,568,519 B2* | 8/2009 | Nakahama | | H01L 23/4735 |
| | | | | 165/104.33 |
| 8,464,781 B2* | 6/2013 | Kenny | | F04B 17/00 |
| | | | | 165/104.33 |
| 9,696,068 B2* | 7/2017 | Matsunaga | | F25B 39/028 |
| 10,018,430 B2* | 7/2018 | Kandlikar | | F28F 13/08 |
| 2001/0023758 A1* | 9/2001 | Osakabe | | F28D 15/0233 |
| | | | | 165/104.33 |
| 2002/0053420 A1* | 5/2002 | Matsuki | | H01L 23/427 |
| | | | | 165/80.4 |
| 2004/0168447 A1* | 9/2004 | Sugito | | F25B 23/006 |
| | | | | 62/114 |
| 2004/0196633 A1* | 10/2004 | Wong | | F28D 15/0233 |
| | | | | 361/700 |
| 2004/0206477 A1* | 10/2004 | Kenny | | F04B 17/00 |
| | | | | 165/80.4 |
| 2005/0083657 A1* | 4/2005 | Hamman | | F28D 15/00 |
| | | | | 361/699 |
| 2005/0111188 A1* | 5/2005 | Bhattacharya | | H01L 23/427 |
| | | | | 361/699 |
| 2005/0286227 A1* | 12/2005 | Erturk | | H01L 23/427 |
| | | | | 361/702 |
| 2006/0037739 A1* | 2/2006 | Utsunomiya | | G06F 1/203 |
| | | | | 165/104.33 |
| 2006/0113661 A1* | 6/2006 | Yamabuchi | | G05D 23/192 |
| | | | | 257/706 |
| 2006/0137860 A1* | 6/2006 | Prasher | | F28D 15/0266 |
| | | | | 165/104.33 |
| 2006/0162903 A1* | 7/2006 | Bhatti | | F28D 15/0266 |
| | | | | 165/104.14 |
| 2006/0196640 A1* | 9/2006 | Siu | | F28D 15/046 |
| | | | | 165/104.26 |
| 2007/0215316 A1* | 9/2007 | Saito | | H02M 7/003 |
| | | | | 165/41 |
| 2008/0308258 A1* | 12/2008 | Pan | | F28F 3/12 |
| | | | | 165/104.19 |
| 2009/0266098 A1* | 10/2009 | Nishijima | | G03B 21/16 |
| | | | | 62/259.2 |
| 2010/0314093 A1* | 12/2010 | Refai-Ahmed | | F28D 15/0266 |
| | | | | 165/287 |
| 2011/0048676 A1* | 3/2011 | Toyoda | | F28D 1/05366 |
| | | | | 165/104.21 |
| 2011/0277491 A1* | 11/2011 | Wu | | H01L 23/4336 |
| | | | | 62/177 |
| 2012/0312504 A1* | 12/2012 | Suzuki | | H01L 23/427 |
| | | | | 165/104.21 |
| 2013/0160485 A1* | 6/2013 | Teraki | | H01L 23/473 |
| | | | | 62/498 |
| 2014/0190669 A1* | 7/2014 | Hoshino | | F28F 3/12 |
| | | | | 165/104.33 |
| 2014/0192485 A1* | 7/2014 | Rau | | H05K 7/2029 |
| | | | | 361/700 |
| 2015/0216079 A1* | 7/2015 | Kondou | | F28F 1/40 |
| | | | | 165/104.21 |
| 2015/0241096 A1* | 8/2015 | Matsunaga | | H01L 23/427 |
| | | | | 62/527 |
| 2016/0282023 A1* | 9/2016 | Matsunaga | | F28D 15/06 |
| 2016/0351471 A1* | 12/2016 | Suwada | | H01L 23/473 |
| 2018/0307283 A1* | 10/2018 | Dupont | | G06F 1/203 |

FOREIGN PATENT DOCUMENTS

| | | |
|---|---|---|
| JP | 2000-121264 A | 4/2000 |
| JP | 2002-228389 A | 8/2002 |
| JP | 2013-16590 | 1/2013 |
| JP | 2013-26362 A | 2/2013 |
| JP | 2013-44496 A | 3/2013 |

OTHER PUBLICATIONS

Japanese Office Action dated Apr. 3, 2017 in Japanese Application No. 2017-507251 (with English translation), 8 pages.

Chinese Office Action issued in Chinese Patent Application No. 201580077908.5 dated Nov. 2, 2018 (w/ English translation).

* cited by examiner (a)

(b)

COOLING DEVICE, POWER CONVERSION DEVICE, AND COOLING SYSTEM

TECHNICAL FIELD

The present invention relates to a power conversion device in which heat generating bodies, such as electronic devices used for converting power, are provided on a cooling device, and a cooling system that uses the power conversion device.

BACKGROUND ART

Cooling systems in which air or liquid refrigerant is circulated are widely known. For example, in a cooling system that uses liquid refrigerant, the liquid refrigerant is circulated by a pump, heat generating bodies are cooled by a cooling device, and heat is rejected by a radiator. Furthermore, a configuration in which liquid refrigerant is boiled in a cooling device, thereby improving the cooling capacity, is disclosed (for example, see Patent Literature 1).

CITATION LIST

Patent Literature

Patent Literature 1: Japanese Unexamined Patent Application Publication No. 2013-44496 (paragraph [0026] and FIG. 1)

SUMMARY OF INVENTION

Technical Problem

In such a cooling system, bubbles produced by boiling in the cooling device may flow into the pump. Because condensation of bubbles in the pump causes cavitation, problems of vibration, noise, and damage to pipes and other components are caused.

The present invention has been made to overcome the above-described problem, and an object of the present invention is to provide a cooling device, a power conversion device, and a cooling system in which bubbles produced by boiling in the cooling device are inhibited from flowing out of the cooling device, and thus, vibration, noise, and damage to pipes and other components can be prevented.

Solution to Problem

A cooling device of one embodiment of the present invention includes a housing including a hollow interior, the housing having a refrigerant inlet from which refrigerant flows in and a refrigerant outlet from which the refrigerant flows out, and having, in the hollow interior, a refrigerant flow path through which the refrigerant flows, and an opening body provided in the housing, dividing the refrigerant flow path into a first area including a heating surface being at least one of a bottom surface and side surfaces of the housing and heating the refrigerant, and a second area including the refrigerant inlet and the refrigerant outlet, and having a plurality of openings inhibiting bubbles produced in the first area from moving to the second area.

Furthermore, a power conversion device of one embodiment of the present invention includes a housing including a hollow interior, the housing having a refrigerant inlet from which refrigerant flows in and a refrigerant outlet from which the refrigerant flows out, and having, in the hollow interior, a refrigerant flow path through which the refrigerant flows, an electronic device provided on at least one of an outer bottom surface and outer side surfaces of the housing and heating the refrigerant inside the housing, and an opening body provided in the housing, dividing the refrigerant flow path into a first area including a heating surface of the housing, on which the electronic device is provided, and a second area including the refrigerant inlet and the refrigerant outlet, and having a plurality of openings inhibiting bubbles produced in the first area from moving to the second area.

Furthermore, a cooling system of one embodiment of the present invention is a cooling system performing cooling by circulating refrigerant, the cooling system including refrigerant pipes through which the refrigerant flows, a pump connected to the refrigerant pipes and circulating the refrigerant inside the refrigerant pipes, a radiator connected to the refrigerant pipes and rejecting heat of the refrigerant circulated by the pump to the outside, and a power conversion device connected to the refrigerant pipes and cooled by the refrigerant circulated by the pump. The power conversion device includes a housing having a hollow interior, housing has a refrigerant inlet from which refrigerant flows in and a refrigerant outlet from which the refrigerant flows out, and has, in the hollow interior, a refrigerant flow path through which the refrigerant flows, an electronic device provided on at least one of an outer bottom surface and outer side surfaces of the housing and heating the refrigerant inside the housing, and an opening body provided in the housing, dividing the refrigerant flow path into a first area including a heating surface of the housing, on which the electronic device is provided, and a second area including the refrigerant inlet and the refrigerant outlet, and having a plurality of openings inhibiting bubbles produced in the first area from moving to the second area.

Advantageous Effects of Invention

With the cooling device, the power conversion device, and the cooling system of one embodiment of the present invention, bubbles produced by boiling in the cooling device can be inhibited from flowing out of the cooling device, and thus, vibration, noise, and damage to pipes and other components can be prevented.

DESCRIPTION OF EMBODIMENTS

Embodiment 1

Figure 1:
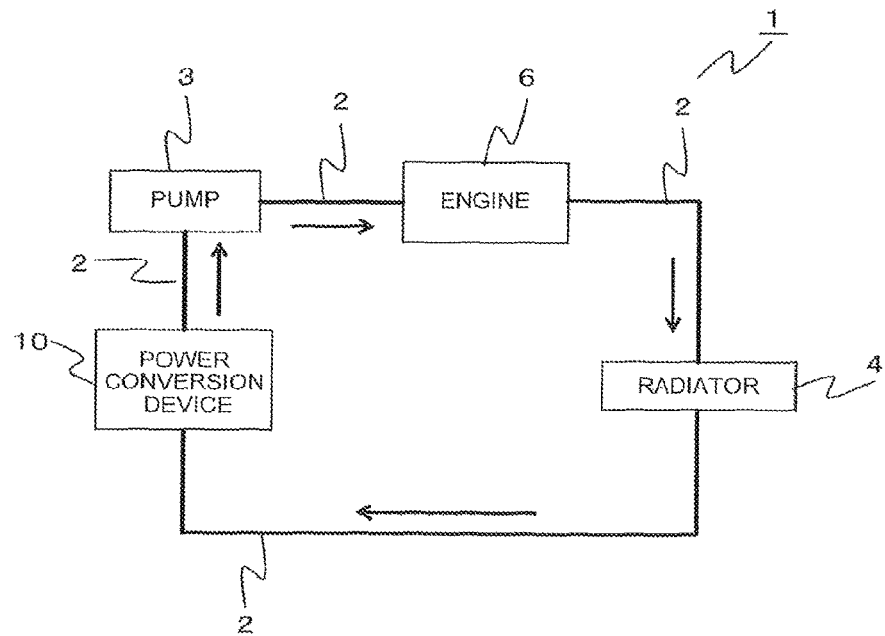
FIG. 1 is a schematic diagram of a cooling system according to Embodiment 1 of the present invention.

A cooling system 1, a power conversion device 10, and a cooling device 20 according to Embodiment 1 of the present invention will be described with reference to FIGS. 1 to 6. Note that, in the drawings, components denoted by the same reference sign are the same or corresponding components, and this reference sign applies to the entire text of the description.

FIG. 1 is a schematic diagram of the cooling system 1 according to Embodiment 1 of the present invention. As shown in FIG. 1, the cooling system 1 according to Embodiment 1 of the present invention includes the power conversion device 10, a pump 3, an engine 6, and a radiator 4. The cooling system 1 according to Embodiment 1 of the present invention is the cooling system 1 that performs cooling by circulating liquid refrigerant as refrigerant and is installed in a vehicle, such as a car and a train. In the cooling system 1, the pump 3 is connected to the power conversion device 10 and the engine 6 via refrigerant pipes 2, through which refrigerant flows, and the radiator 4 is connected to the engine 6 and the power conversion device 10 via the refrigerant pipes 2, thus forming a circulation flow path. As shown in FIG. 1, in Embodiment 1 of the present invention, the pump 3, the engine 6, the radiator 4, and the power conversion device 10 are disposed clockwise.

The pump 3 is a driving source that circulates liquid refrigerant in the refrigerant pipes 2. The refrigerant circulated by the pump 3 receives heat in the power conversion device 10 and rejects heat to the outside in the radiator 4. Note that the cooling system 1 may include a reservoir tank for storing excess liquid of the refrigerant. Furthermore, the reservoir tank may be released to the atmospheric pressure to remove gas, such as air, that is dissolved in the refrigerant. The reservoir tank may be provided, for example, between the radiator 4 and the power conversion device 10.

Figure 2:
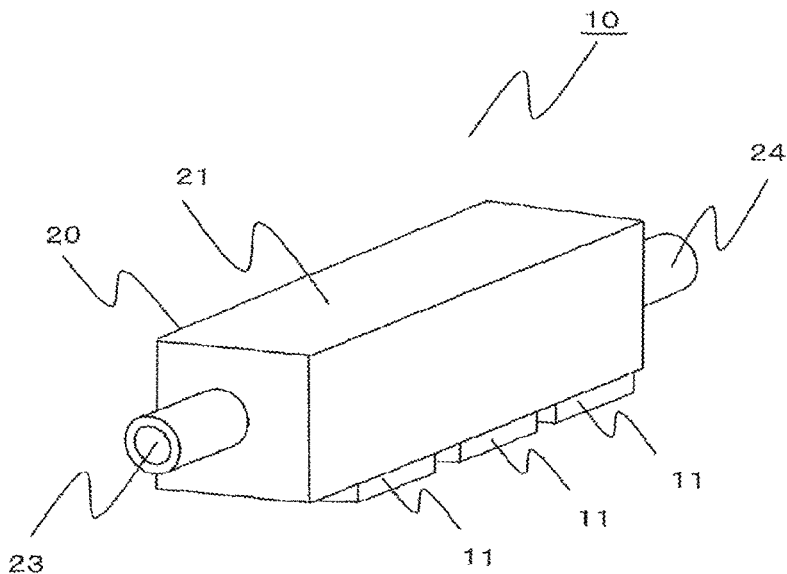
FIG. 2 is an external perspective view of a power conversion device according to Embodiment 1 of the present invention.

FIG. 2 is an external perspective view of the power conversion device 10 according to Embodiment 1 of the present invention. The power conversion device 10 according to Embodiment 1 of the present invention includes electronic devices 11 and a cooling device 20. The electronic devices 11 that generate heat are provided on the outside of a housing 21 of the cooling device 20, whereby the heat of the electronic devices 11 is removed. The electronic devices 11 are provided on at least one of the outer bottom surface and the outer side surfaces of the housing 21. In the power conversion device 10 according to Embodiment 1 of the present invention, the electronic devices 11 are provided on the bottom surface. Note that, when the power conversion device 10 including the housing 21 is installed in a vehicle or other place, in the housing 21, in the vertical direction, the upper surface is assumed to be the top surface, the lower surface is assumed to be the bottom surface, and the surfaces in the horizontal direction are assumed to be the side surfaces.

Furthermore, a refrigerant flow path is provided in the housing 21 of the cooling device 20, and the refrigerant flows into the refrigerant flow path from a refrigerant inlet 23 and flows out of the refrigerant flow path from a refrigerant outlet 24. As a result of the electronic devices 11 heating the refrigerant in the housing 21, the heat of the electronic devices 11 is removed. Note that, examples of the electronic devices 11 that generate heat include a control circuit, a driving circuit, a capacitor, an SiC or other power module, and a step-down converter. However, the electronic devices 11 are not limited to this configuration. The electronic devices 11 are connected to one another via harnesses or other members.

Figure 3:
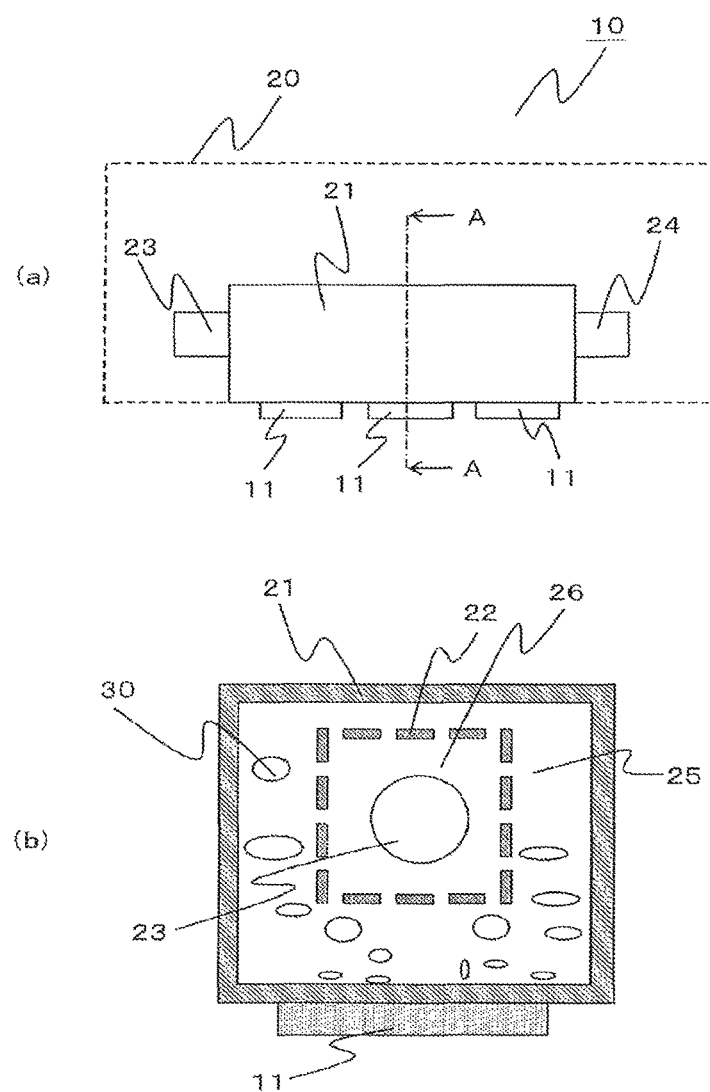
FIG. 3 includes a side view of the power conversion device according to Embodiment 1 of the present invention and a sectional view at position A-A.
Figure 4:
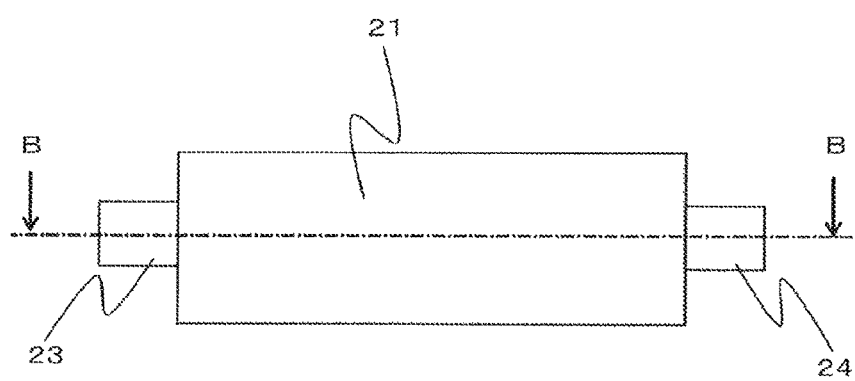
FIG. 4 is a top view of the power conversion device according to Embodiment 1 of the present invention.
Figure 5:
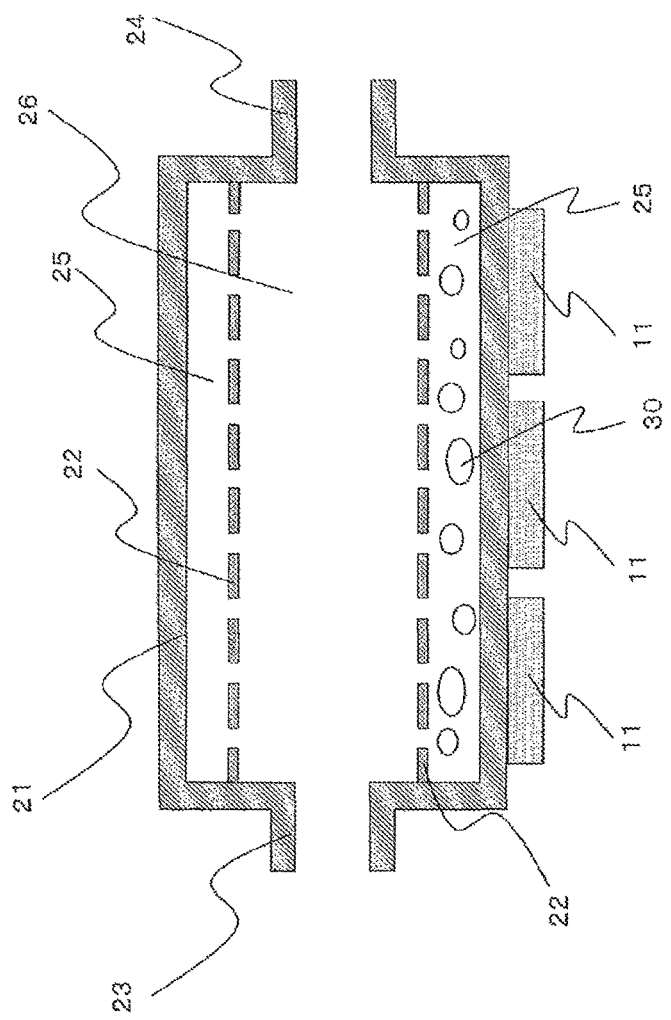
FIG. 5 is a sectional view of the power conversion device according to Embodiment 1 of the present invention at position B-B.

Next, the structure of the cooling device 20 will be described. FIG. 3 includes a side view of the power conversion device 10 according to Embodiment 1 of the present invention, and a sectional view at position A-A. FIG. 3(a) shows position A-A in the side view of the power conversion device 10. FIG. 3(b) is a sectional view of the power conversion device 10 at position A-A. FIG. 4 is a top view of the power conversion device 10 according to Embodiment 1 of the present invention. FIG. 4 shows position B-B in the top view of the power conversion device 10. FIG. 5 is a sectional view at position B-B in the power conversion device 10 according to Embodiment 1 of the present invention.

The cooling device 20 includes the housing 21 and an opening body 22. The housing 21 is a prism with a hollow interior that has the refrigerant inlet 23 from which the refrigerant flows in and the refrigerant outlet 24 from which the refrigerant flows out, and has, in the hollow interior of the prism, a refrigerant flow path through which the refrigerant flows. The housing 21 according to Embodiment 1 of the present invention is formed of a rectangular prism. The opening body 22 divides the refrigerant flow path into a first area 25 including a heating surface of the housing 21, on which the electronic devices 11 are provided, and a second area 26 including the refrigerant inlet 23 and the refrigerant outlet 24. When it is defined that the straight line connecting the refrigerant inlet 23 and the refrigerant outlet 24 extends in the axial direction, the opening body 22 is provided in the refrigerant flow path to extend in the axial direction, divides the refrigerant flow path, and inhibits bubbles produced in the vicinity of the heating surface in the first area from moving to the second area. In Embodiment 1 of the present invention, the second area 26 includes the refrigerant inlet 23 and the refrigerant outlet 24. Furthermore, the heating surface is a wall surface of the housing 21 of the cooling device 20 corresponding to portions where the electronic devices 11 are provided. In the first area 25, the refrigerant in the housing 21 is heated by the electronic devices 11 that generate heat, and, as a result of the refrigerant boiling mainly from the heating surface, on which the electronic devices 11 are provided, bubbles 30 are produced. Note that, because the heat of the electronic devices 11 spreads in the housing 21 by thermal conduction, boiling does not necessarily occur solely from the heating surface.

Note that, in Embodiment 1 of the present invention, because the refrigerant inlet 23 is included in the second area 26, low-temperature refrigerant that has rejected heat in the radiator 4 and thus has a temperature lower than the saturated temperature and flows in from the refrigerant inlet 23 can be inhibited from flowing to the bottom of the housing 21 of the cooling device 20. Hence, because the low-temperature refrigerant can be inhibited from cooling the bottom of the housing 21, the bubbles 30 due to boiling can be facilitated to generate from the bottom of the housing 21 of the cooling device 20.

In Embodiment 1 of the present invention, although the refrigerant inlet 23 and the refrigerant outlet 24 are provided in the side surfaces of the housing 21, the positions are not limited to the side surfaces of the housing 21. Furthermore, the cooling device 20 is a thin metal plate formed of a metal, such as aluminum, aluminum alloy, and stainless steel.

The sectional shape of the cooling device 20 does not necessarily have to be rectangular as shown in FIG. 3(b), and the sectional shape may be circular, triangular, polygonal, or other shape. As shown in FIG. 3(b), with a rectangular shape having an aspect ratio of the sectional shape of 1 or a value close to substantially 1, installation in a vehicle or other place is easy. The aspect ratio is preferably 0.9 to 1.1, and more preferably 1. This configuration provides an advantage in that installation in a particularly small space, such as an engine room, becomes easy.

Furthermore, refrigerant, such as water, LLC (long life coolant) for vehicles, and Fluorinert, may be used as the refrigerant.

Figure 6:
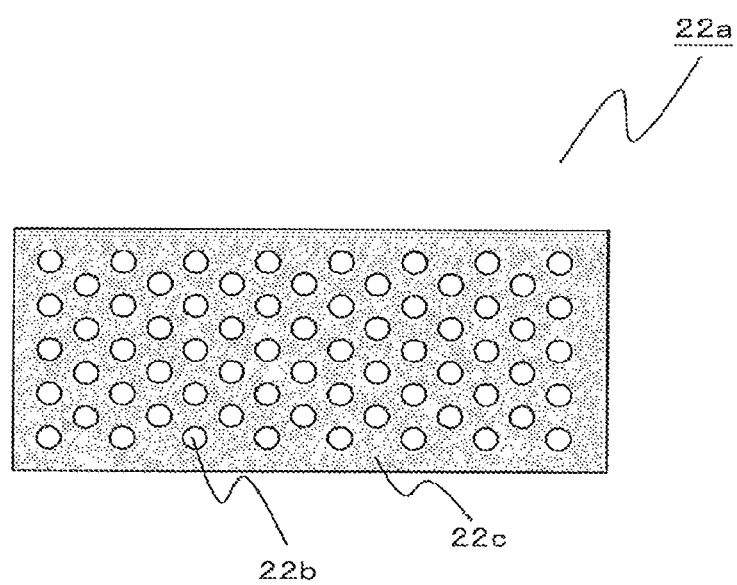
FIG. 6 is a top view of a punched metal sheet according to Embodiment 1 of the present invention.

FIG. 6 is a top view of a punched metal sheet 22a according to Embodiment 1 of the present invention. In Embodiment 1 of the present invention, the punched metal sheet 22a is used as the opening body 22. The punched metal sheet 22a, wire mesh, or other member is mainly used as the opening body 22. The punched metal sheet 22a, which is shown as an example of the opening body 22, has a plurality of openings 22b in a flat plate part 22c. Thus, the refrigerant can move between the first area 25 and the second area 26 through the openings 22b.

Meanwhile, the provision of the opening body 22 can inhibit the bubbles 30 produced as a result of the refrigerant boiling from moving from the first area 25 to the second area 26. This is because the bubbles 30 can be inhibited from moving from the first area 25 to the second area 26 by a capillary phenomenon occurring in the openings 22b in the opening body 22. Furthermore, more than one opening body 22 may be used.

The opening diameter of the openings 22b may be smaller than the diameter of the bubbles 30 produced by boiling when the bubbles 30 are separated from the wall surface of the housing 21. Fritz's expression, shown in Expression (1) below, can be used to estimate the diameter of the bubbles 30 produced by boiling when the bubbles 30 are separated from the wall surface of the housing 21. Specifically, the opening body 22 may be configured such that the opening diameter of the openings 22b is smaller than the diameter of the bubbles 30, calculated by Expression (1) below. Herein, d is the diameter [m] of the bubbles 30, $\phi$ is the contact angle [degrees] when the bubbles 30 are separated from the wall surface, $\sigma$ is the surface tension [N/m] of the refrigerant, g is the gravitational acceleration [m$^2$/s], $\rho l$ is the density [kg/m$^3$] of the liquid refrigerant, and $\rho v$ is the density [kg/m$^3$] of the saturated vapor of the refrigerant. For reference, the diameter of the bubbles 30 is estimated by using Fritz's expression. When the refrigerant is water, the diameter of the bubbles 30 produced by boiling when the bubbles 30 are separated from the wall surface of the housing 21 is approximately 2 to 3 mm, and, when the refrigerant is LLC, the diameter of the bubbles 30 produced by boiling when the bubbles 30 are separated from the wall surface of the housing 21 is approximately 1 mm.

$$d=0.0209\phi\sqrt{(\sigma/(g(\rho l-\rho v)))} \qquad \text{Fritz's expression:}$$

When the openings 22b are circular, it is preferable that the opening diameter of the openings 22b be 0.1 to 3.0 mm, and it is more preferable that the opening diameter of the openings 22b be 0.5 to 2.5 mm. When the opening diameter is greater than 3.0 mm, the bubbles 30 may easily pass through the openings 22b. Furthermore, when the opening diameter is less than 0.1 mm, the liquid refrigerant hardly moves between the first area 25 and the second area 26, which may lower the cooling efficiency. Note that the opening diameter of the openings 22b is not limited to 0.1 to 3.0 mm. In the opening body 22, the size of the opening diameter of the openings 22b or the aperture ratio may be arbitrarily adjusted. Herein, the shape of the openings 22b is not limited to circular, and may be any of other various shapes, such as elliptical, square, triangular, and rectangular. When the shape of the openings 22b is other than circular, the equilibrium diameter may be used as the opening diameter. Furthermore, a porous body may be used as the opening body 22. When a porous body is used, the average value of the diameters of air holes in the porous body may be used as the opening diameter. In addition, the openings 22b only need to have an opening width that is smaller than the diameter of the bubbles 30 and, hence, may be, for example, something like slits, in which one opening 22b has an opening width that is smaller than the diameter of the bubbles 30, and the other opening width is large.

A frame to which the opening body 22 is to be attached may be provided on the housing 21 so that the opening body 22 can be easily attached to the housing 21. By doing so, in response to a specification change, such as when the refrigerant is changed, when the electronic devices 11 are changed, leading to a change in the amount of heat generated by the electronic devices 11, and when the outside temperature changes, the opening body 22 can be easily replaced, and thus, the opening diameter of the openings 22b can be changed. The methods of fixing the opening body 22 include fixing to the wall surfaces of the housing 21 with screws, fixing by welding and other method. In Embodiment 1 of the present invention, the punched metal sheet 22a is fixed to the wall surfaces of the housing 21 by welding. It is preferable that the material of the opening body 22 be the same as the material of the housing 21 of the cooling device 20. With this configuration, corrosion can be prevented.

Next, the operation of the cooling system 1, the power conversion device 10, and the cooling device 20 according to Embodiment 1 of the present invention will be described. As shown by arrows in FIG. 1, the pump 3 feeds the refrigerant in the direction of the engine 6. The refrigerant sequentially flows through the engine 6, the radiator 4, the power conversion device 10, and the pump 3, thereby circulating in the cooling system 1. The refrigerant receives heat in the power conversion device 10 and rejects heat in the radiator 4.

The refrigerant inlet 23 shown in FIG. 2 is connected to the radiator 4 side, and the refrigerant outlet 24 side is connected to the pump 3 side. The refrigerant flows from the refrigerant inlet 23 toward the refrigerant outlet 24. As shown in FIG. 3(b), in the power conversion device 10 in which the electronic devices 11 that generate heat are provided on the bottom surface of the cooling device 20, the refrigerant in the cooling device 20 is heated to boil by the heat of the electronic devices 11, from the heating surface at the bottom surface of the cooling device 20, producing the bubbles 30.

Herein, the boiling occurs when the wall-surface temperature inside the housing 21 reaches or exceeds the saturated temperature of the refrigerant. When the bubbles 30 are separated from the wall surface inside the housing 21, the ambient refrigerant flows into the portions from which the bubbles 30 depart. As a result, the heat transfer coefficient is improved by convection of the refrigerant. In addition, because the bubbles produced by boiling removes, from the ambient refrigerant, heat whose amount corresponds to the latent heat needed for a phase change of the refrigerant, the ambient refrigerant is cooled. As a result, the amount of heat transferred from the wall surface of the housing 21 to the refrigerant increases, and thus, the electronic devices 11 are cooled.

The produced bubbles 30 rise in the cooling device 20 by buoyancy. Although the bubbles 30 rise in the cooling device 20, in Embodiment 1, the punched metal sheet 22a, serving as the opening body 22, is provided to divide the refrigerant flow path in the first area 25 including the heating surface, from which the bubbles 30 are mainly produced, and the second area 26 including the refrigerant inlet 23 and the refrigerant outlet 24. Hence, as a result of a capillary phenomenon occurring in the openings 22b in the punched metal sheet 22a, serving as the opening body 22, the bubbles 30 can be inhibited from passing through the openings 22b and reaching the pump 3 via the refrigerant outlet 24. Furthermore, even when a few bubbles 30 pass through the openings 22b in the punched metal sheet 22a, the bubbles 30 exchange heat with low-temperature refrigerant that has rejected heat in the radiator 4 and has a temperature lower than the saturated temperature, and flows in from the refrigerant inlet 23, and most of the bubbles 30 quickly condense and return to the liquid refrigerant. Thus, the bubbles 30 can be inhibited from flowing in the pump 3.

Note that the pressure of the refrigerant, which is increased by the pump 3, decreases due to pressure loss as the refrigerant flows sequentially through the engine 6, the radiator 4, and the power conversion device 10. For the refrigerant in the cooling device 20 to be heated to boil by the heat of the electronic devices 11, from the heating surface at the bottom surface of the cooling device 20, to produce the bubbles 30, the lower the pressure of the refrigerant is, more easily boiling can be caused. To this end, the power conversion device 10 is disposed close to the pump 3, and the refrigerant outlet 24 is connected to the pump 3 so that the refrigerant flows from the power conversion device 10 to the pump 3. With this configuration, in the cooling system 1, the pressure of the refrigerant flowing in the power conversion device 10 can be made particularly small, and hence, it is possible to easily cause boiling from the bottom surface of the cooling device 20 and produce the bubbles 30. Note that, although it is preferable that the power conversion device 10 be disposed as close to the pump 3 as possible, the power conversion device 10 is not limited to this configuration, and some device may be provided between the pump 3 and the power conversion device 10.

As has been described above, the cooling system 1 according to Embodiment 1 of the present invention is the cooling system 1 that performs cooling by circulating refrigerant and includes the refrigerant pipes 2 through which the refrigerant flows, the pump 3 that is connected to the refrigerant pipes 2 and circulates the refrigerant in the refrigerant pipes 2, the radiator 4 that is connected to the refrigerant pipes 2 and rejects the heat of the refrigerant circulated by the pump to the outside, and the power conversion device 10 that is connected to the refrigerant pipes 2 and is cooled by the refrigerant circulated by the pump. The power conversion device 10 includes the housing 21 that is a prism with a hollow interior, the prism having the refrigerant inlet 23 from which the refrigerant flows in and the refrigerant outlet 24 from which the refrigerant flows out, and has, in the hollow interior of the prism, the refrigerant flow path through which the refrigerant flows, the electronic devices 11 that are provided on at least one of the outer bottom surface and the outer side surfaces of the housing 21 and heat the refrigerant in the housing 21, and the opening body 22 that is provided in the housing 21, divides the refrigerant flow path into the first area 25 including the heating surface of the housing 21, on which the electronic devices 11 are provided, and the second area 26 including the refrigerant inlet 23 and the refrigerant outlet 24, and has the plurality of openings 22b that inhibit the bubbles 30 produced in the first area 25 from moving to the second area 26.

Furthermore, the power conversion device 10 according to Embodiment 1 of the present invention includes the housing 21, for example a prism with a hollow interior, the housing having the refrigerant inlet 23 from which the refrigerant flows in and the refrigerant outlet 24 from which the refrigerant flows out, and has, in the hollow interior, the refrigerant flow path through which the refrigerant flows, the electronic devices 11 that are provided on at least one of the outer bottom surface and the outer side surfaces of the housing 21 and heat the refrigerant in the housing 21, and the opening body 22 that is provided in the housing 21, divides the refrigerant flow path into the first area 25 including the heating surface of the housing 21, on which the electronic devices 11 are provided, and the second area 26 including the refrigerant inlet 23 and the refrigerant outlet 24, and has a plurality of openings 22b that inhibit the bubbles 30 produced in the first area 25 from moving to the second area 26.

Furthermore, the cooling device 20 according to Embodiment 1 of the present invention includes the housing 21, for example a prism, with a hollow interior, the housing having the refrigerant inlet 23 from which the refrigerant flows in and the refrigerant outlet 24 from which the refrigerant flows out, and has, in the hollow interior, the refrigerant flow path through which the refrigerant flows, and the opening body 22 that is provided in the housing 21, divides the refrigerant flow path into the first area 25 including the heating surface that is at least one of the bottom surface and side surfaces of the housing 21 and heats the refrigerant, and the second area 26 including the refrigerant inlet 23 and the refrigerant outlet 24, and has a plurality of openings 22b that inhibit the bubbles 30 produced in the first area 25 from moving to the second area 26.

With this configuration, because the opening body 22 divides the refrigerant flow path in the cooling device 20 into the first area 25 including the heating surface and the second area 26 including the refrigerant inlet 23 and the refrigerant outlet 24, the bubbles 30 produced by boiling in the first area 25 can be inhibited from flowing into the second area 26, and thus to inhibit the bubbles 30 from flowing out of the cooling device 20. Consequently, the bubbles 30 produced by boiling in the cooling device 20 can be inhibited from flowing into the pump 3, and thus to prevent cavitation caused by the condensation of the bubbles 30 in the pump 3. Furthermore, it is possible to obtain the cooling device 20, the power conversion device 10, and the cooling system 1 in which the bubbles 30 produced by boiling in the cooling device 20 can be inhibited from flowing out of the cooling device 20, and thus to prevent vibration, noise, and damage to the pipes and other components.

Furthermore, by providing, on the housing 21, the frame to which the opening body 22 is attached, replacement of the opening body 22, attachment of a plurality of opening bodies 22 in a stack state, and other task becomes easy. Hence, in response to a specification change, such as when the refrigerant is changed, and when the electronic devices 11 are changed, leading to a change in the amount of heat generated by the electronic devices 11, the opening diameter, the aperture ratio, and other factors of the opening body 22 can be easily adjusted. With this configuration, it is possible to adjust, as appropriate, the flow rate of refrigerant flowing between the first area 25 and the second area 26 and other factors, and thus to improve the efficiency of cooling the electronic devices 11 that generate heat.

In Embodiment 1 of the present invention, the electronic devices 11 that generate heat are cooled by using a boiling phenomenon. Typically, in cooling of the electronic devices 11, because the heat transfer coefficient increases with an increase in the flow rate of the refrigerant flowing in from the refrigerant inlet 23, the efficiency of cooling the electronic devices 11 is improved. Meanwhile, in Embodiment 1 of the present invention, because the electronic devices 11 are cooled by using a boiling phenomenon, the flow rate of the refrigerant flowing in from the refrigerant inlet 23 has almost no effect on the efficiency of cooling the electronic devices 11. Hence, even when the flow rate of the refrigerant flowing in is reduced by increasing the opening diameter of the refrigerant inlet 23 without changing the flow rate of refrigerant flowing in, the efficiency of cooling the electronic devices 11 is not affected. Hence, even when the vertical cross section of the refrigerant flow path is made larger than the vertical inflow cross section of the refrigerant inlet 23, the pressure loss in the cooling device 20 can be reduced without affecting the cooling efficiency, a high pressure-boosting capability of the pump 3 becomes unnecessary, and thus, the output of the pump 3 can be reduced. Consequently, the pump 3 can be made compact, and thus, the weight, size, and cost of the cooling system 1 can be reduced.

Embodiment 2

The cooling system 1, the power conversion device 10, and the cooling device 20 according to Embodiment 2 of the present invention will be described below with reference to FIG. 7. Note that, in the cooling system 1, the power conversion device 10, and the cooling device 20 according to Embodiment 1, a configuration in which one opening body 22 is attached has been described. In Embodiment 2 of the present invention, a configuration in which a plurality of opening bodies 22 are attached will be described. Hereinbelow, the difference from Embodiment 1 will be mainly described, and descriptions of the same or corresponding parts will be omitted.

Figure 7:
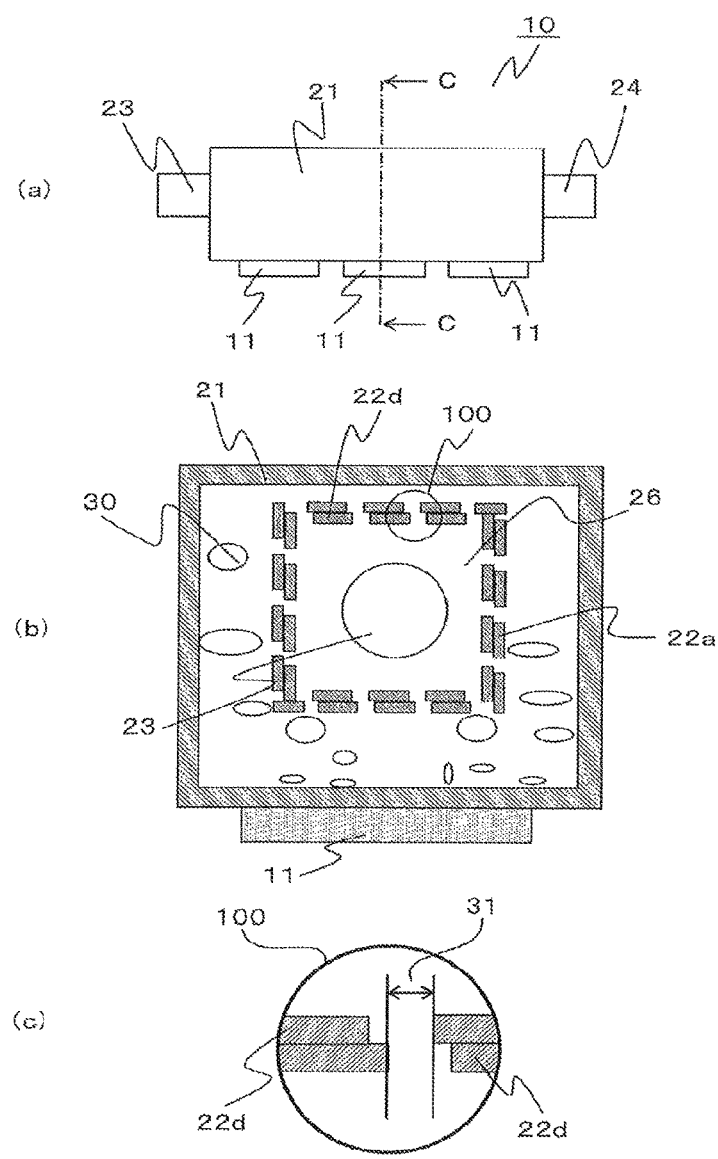
FIG. 7 includes a side view of the power conversion device according to Embodiment 2 of the present invention, a sectional view at position C-C, and an enlarged view.

FIG. 7 includes a side view of the power conversion device 10 according to Embodiment 2 of the present invention, a sectional view at position C-C, and an enlarged view. FIG. 7(a) is a side view of the power conversion device 10 and shows position C-C, and FIG. 7(b) is a sectional view at position C-C. Note that, in a modification of the shape of the opening body 22 shown in FIG. 7, similarly to the opening body 22 shown in Embodiment 1, the opening body 22 is provided in the refrigerant flow path to extend in the axial direction and divides the refrigerant flow path. As shown in FIG. 7(b), two opening bodies 22 may be stacked. As in this case, the opening body 22 may be formed not by attaching only one opening member 22d, but by stacking two or more opening members 22d by increasing the number to two, three, or more. When the opening body 22 is formed by stacking two or more opening members 22d, the opening diameter of the opening body 22 that is formed by stacking the opening members 22d is smaller than the opening diameter of the opening body 22 that is formed of one opening member 22d. FIG. 7(c) is an enlarged view of an enlarged part 100 in FIG. 7(b). As shown in FIG. 7(c), as the opening members 22d are stacked, the openings 22b are narrowed. Thus, a substantial opening diameter 31, which is the substantial diameter of the holes, may be used as the opening diameter of the opening body 22. Note that, depending on the stacking condition of the opening members 22d, the substantial opening diameter 31 may vary in size with position. Hence, the average value of the substantial opening diameters 31 may be used as the opening diameter.

With this configuration, because the opening body 22 is formed by stacking two or more opening members 22d, the strength is improved compared with an opening body 22 that is formed of one opening member 22d. Furthermore, by stacking two or more opening members 22d, the opening diameter and the aperture ratio of the opening body 22 can be easily adjusted.

Embodiment 3

The cooling system 1, the power conversion device 10, and the cooling device 20 according to Embodiment 3 of the present invention will be described with reference to FIG. 8. Note that, in the cooling system 1, the power conversion device 10, and the cooling device 20 according to Embodiment 1, the opening body 22 having a rectangular sectional shape has been described. In Embodiment 3 of the present invention, a modification of the shape of the opening body 22 will be described. Hereinbelow, the difference from Embodiment 1 will be mainly described, and descriptions of the same or corresponding parts will be omitted.

Figure 8:
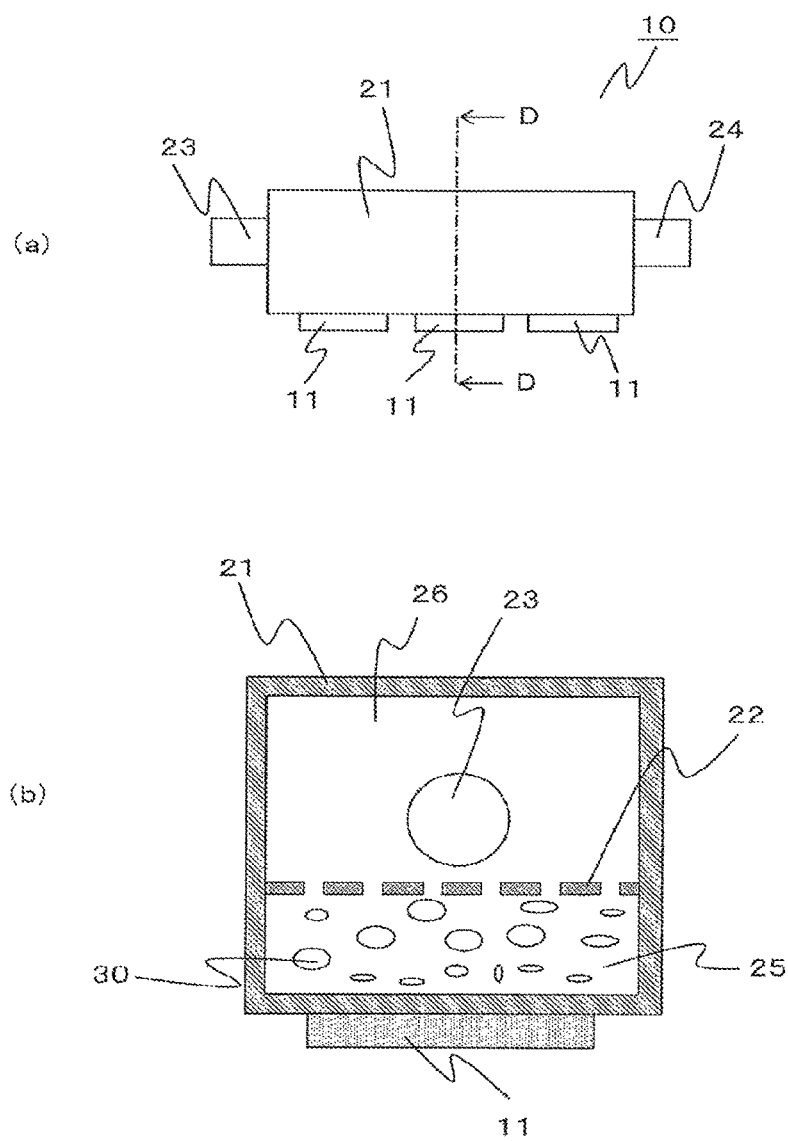
FIG. 8 includes a side view of the power conversion device according to Embodiment 3 of the present invention and a sectional view at position D-D.

FIG. 8 includes a side view of the power conversion device 10 according to Embodiment 3 of the present invention, and a sectional view at position D-D. FIG. 8(a) is a side view of the power conversion device 10 and shows position D-D, and FIG. 8(b) is a sectional view at position D-D. Note that, in the modification of the shape of the opening body 22 shown in FIG. 8, similarly to the opening body 22 shown in Embodiment 1, the opening body 22 is provided in the refrigerant flow path to extend in the axial direction and divides the refrigerant flow path. As shown in FIG. 8, the cross section of the opening body 22 has a straight-line shape extending in the horizontal direction, and both ends of the opening body 22 are fixed to the side surfaces of the housing 21 of the cooling device 20.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 4

The cooling system 1, the power conversion device 10, and the cooling device 20 according to Embodiment 4 of the present invention will be described with reference to FIG. 9. Note that, in the cooling system 1, the power conversion device 10, and the cooling device 20 according to Embodiment 1, the opening body 22 having a rectangular sectional shape has been described. In Embodiment 4 of the present invention, a modification of the shape of the opening body 22 will be described. Hereinbelow, the difference from Embodiment 1 will be mainly described, and descriptions of the same or corresponding parts will be omitted.

Figure 9:
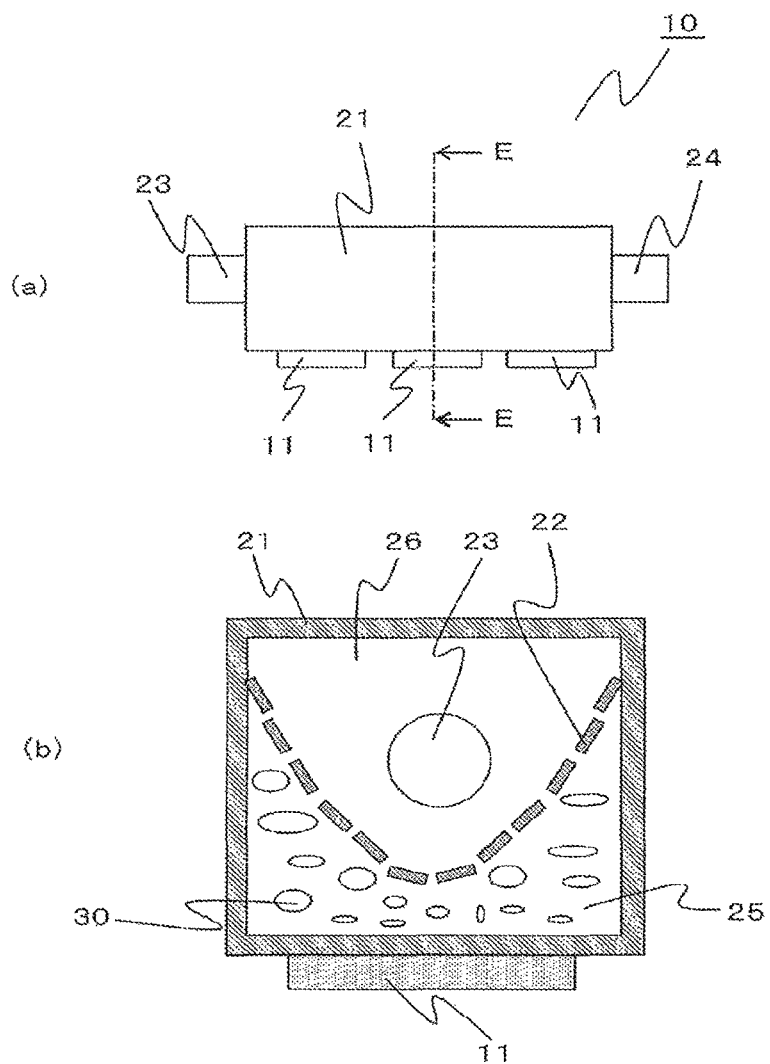
FIG. 9 includes a side view of the power conversion device according to Embodiment 4 of the present invention and a sectional view at position E-E.

FIG. 9 includes a side view of the power conversion device 10 according to Embodiment 4 of the present invention, and a sectional view at position E-E. FIG. 9(a) is a side view of the power conversion device 10 and shows position E-E, and FIG. 9(b) is a sectional view at position E-E. Note that, in the modification of the shape of the opening body 22 shown in FIG. 9, similarly to the opening body 22 shown in Embodiment 1, the opening body 22 is provided in the refrigerant flow path to extend in the axial direction and divides the refrigerant flow path. As shown in FIG. 9, the cross section of the opening body 22 has an arc shape protruding downward. The opening body 22 is fixed at both ends to the side surfaces of the housing 21 of the cooling device 20 and is not in contact with the bottom surface of the housing 21 of the cooling device 20.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 5

The cooling system 1, the power conversion device 10, and the cooling device 20 according to Embodiment 5 of the present invention will be described with reference to FIG. 10. Note that, in the cooling system 1, the power conversion device 10, and the cooling device 20 according to Embodiment 1, the opening body 22 having a rectangular sectional shape has been described. In Embodiment 5 of the present invention, a modification of the shape of the opening body 22 will be described. Hereinbelow, the difference from Embodiment 1 will be mainly described, and descriptions of the same or corresponding parts will be omitted.

Figure 10:
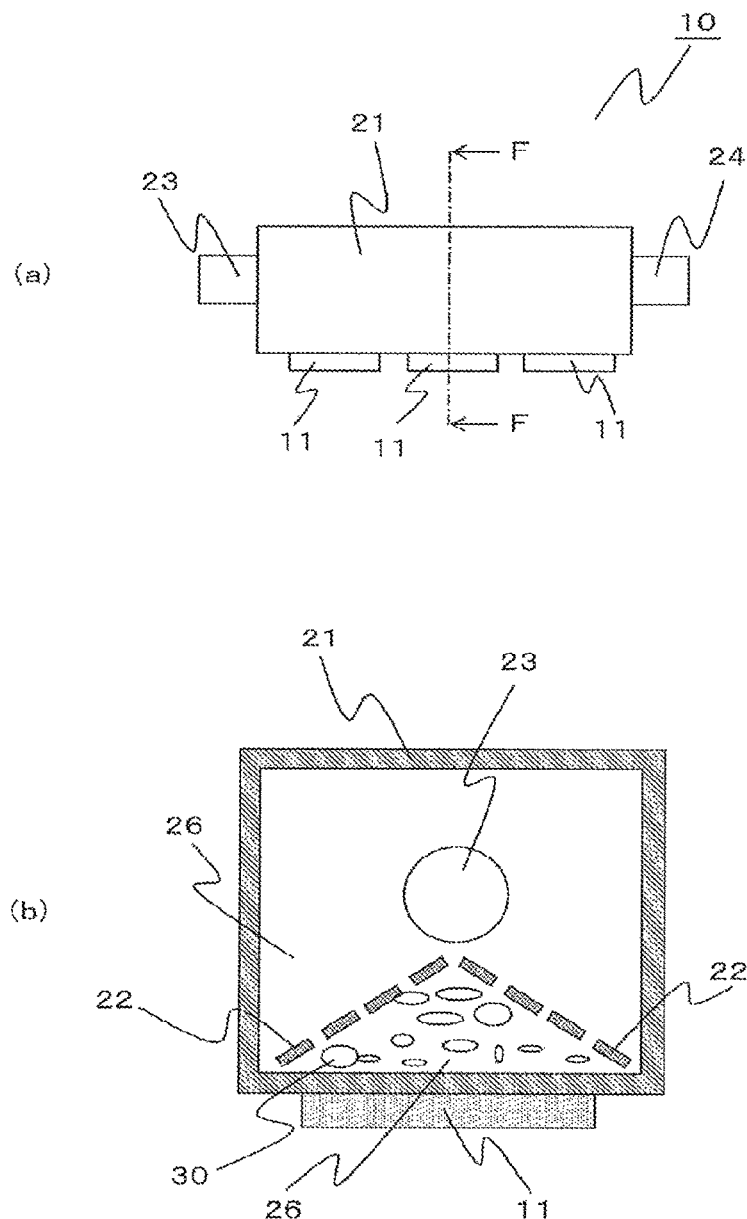
FIG. 10 includes a side view of the power conversion device according to Embodiment 5 of the present invention and a sectional view at position F-F.

FIG. 10 includes a side view of the power conversion device 10 according to Embodiment 5 of the present invention, and a sectional view at position F-F. FIG. 10(a) is a side view of the power conversion device 10 and shows position F-F, and FIG. 10(b) is a sectional view at position F-F. Note that, in the modification of the shape of the opening body 22 shown in FIG. 10, similarly to the opening body 22 shown in Embodiment 1, the opening body 22 is provided in the refrigerant flow path to extend in the axial direction and divides the refrigerant flow path. As shown in FIG. 10(b), the cross section of the opening body 22 has an upward-pointing triangle shape. The ends of the opening body 22 are fixed to the lower two corners of the four corners of the housing 21 of the cooling device 20.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 6

The cooling system 1, the power conversion device 10, and the cooling device 20 according to Embodiment 2 of the present invention will be described with reference to FIG. 11. Note that, in the cooling system 1, the power conversion device 10, and the cooling device 20 according to Embodiment 1, the opening body 22 having a rectangular sectional shape has been described. In Embodiment 6 of the present invention, a modification of the shape of the opening body 22 will be described. Hereinbelow, the difference from Embodiment 1 will be mainly described, and descriptions of the same or corresponding parts will be omitted.

Figure 11:
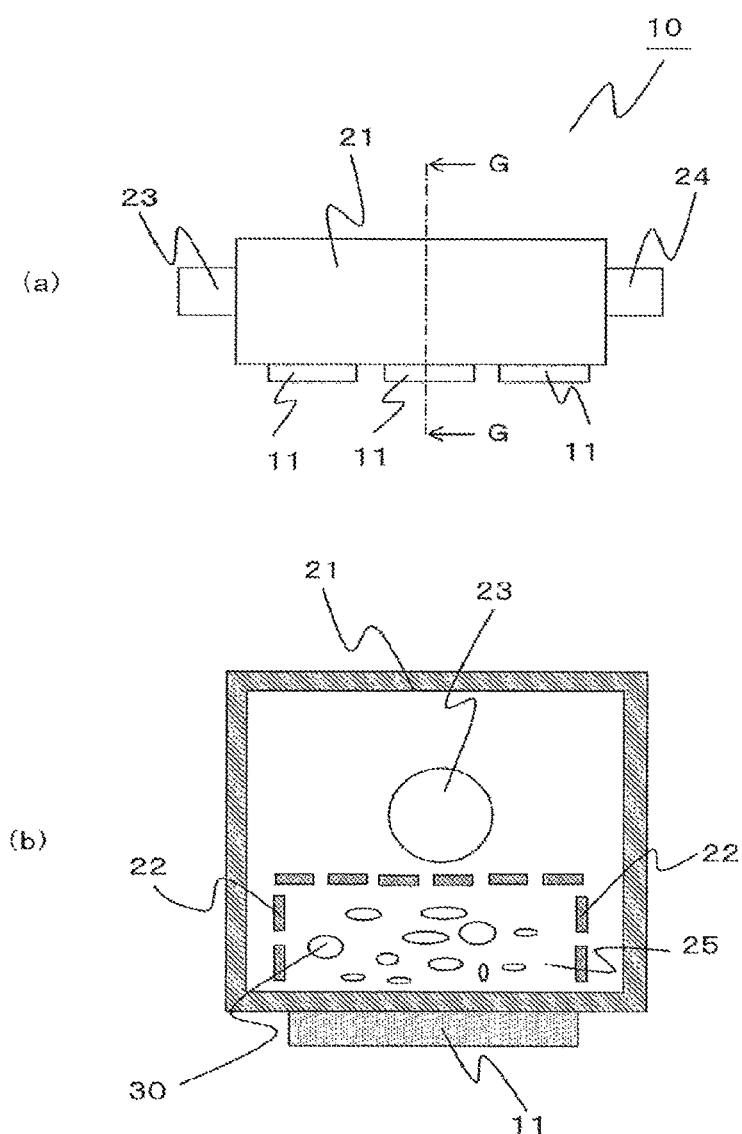
FIG. 11 includes a side view of the power conversion device according to Embodiment 6 of the present invention and a sectional view at position G-G.

FIG. 11 includes a side view of the power conversion device 10 according to Embodiment 6 of the present invention, and a sectional view at position G-G. FIG. 11(a) is a side view of the power conversion device 10 and shows position G-G, and FIG. 11(b) is a sectional view at position G-G. Note that, in the modification of the shape of the opening body 22 shown in FIG. 11, similarly to the opening body 22 shown in Embodiment 1, the opening body 22 is provided in the refrigerant flow path to extend in the axial direction and divides the refrigerant flow path. As shown in FIG. 11(b), the opening body 22 has an angled-U-shaped cross section and is attached to cover the heating surface. The ends of the opening body 22 are fixed to the bottom surface of the housing 21 of the cooling device 20.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 7

The cooling system 1, the power conversion device 10, and the cooling device 20 according to Embodiment 7 of the present invention will be described with reference to FIG. 12. Note that, in the cooling system 1, the power conversion device 10, and the cooling device 20 according to Embodiment 1, the opening body 22 having a rectangular sectional shape has been described. In Embodiment 7 of the present invention, a modification of the shape of the opening body 22 will be described. Hereinbelow, the difference from Embodiment 1 will be mainly described, and descriptions of the same or corresponding parts will be omitted.

Figure 12:
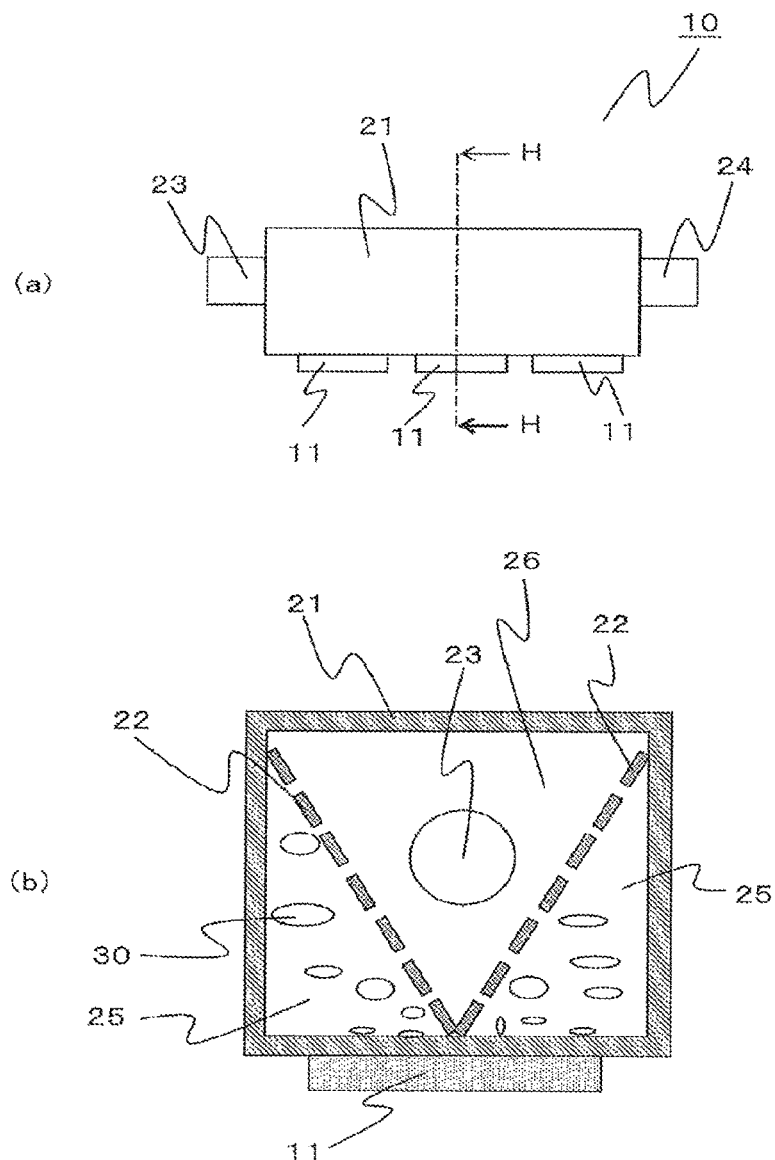
FIG. 12 includes a side view of the power conversion device according to Embodiment 7 of the present invention and a sectional view at position H-H.

FIG. 12 includes a side view of the power conversion device 10 according to Embodiment 7 of the present invention, and a sectional view at position H-H. FIG. 12(a) is a side view of the power conversion device 10 and shows position H-H, and FIG. 12(b) is a sectional view at position H-H. Note that, in the modification of the shape of the opening body 22 shown in FIG. 12, similarly to the opening body 22 shown in Embodiment 1, the opening body 22 is provided in the refrigerant flow path to extend in the axial direction and divides the refrigerant flow path. As shown in FIG. 12(b), the H-H cross section is a vertical section, and the opening body 22 has a V-shaped section. The ends of the opening body 22 are fixed to the upper two corners of the four corners of the housing 21 of the cooling device 20 and a part of the opening body 22 is fixed to the center of the bottom of the housing 21. In Embodiment 7 of the present invention, the first area 25 is divided into two areas by the opening body 22.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 8

The cooling system 1, the power conversion device 10, and the cooling device 20 according to Embodiment 8 of the present invention will be described with reference to FIG. 13. Note that, in the cooling system 1, the power conversion device 10, and the cooling device 20 according to Embodiment 1, the opening body 22 having a rectangular sectional shape has been described. In Embodiment 1 of the present invention, a modification of the shape of the opening body 22 will be described. Hereinbelow, the difference from Embodiment 8 will be mainly described, and descriptions of the same or corresponding parts will be omitted.

Figure 13:
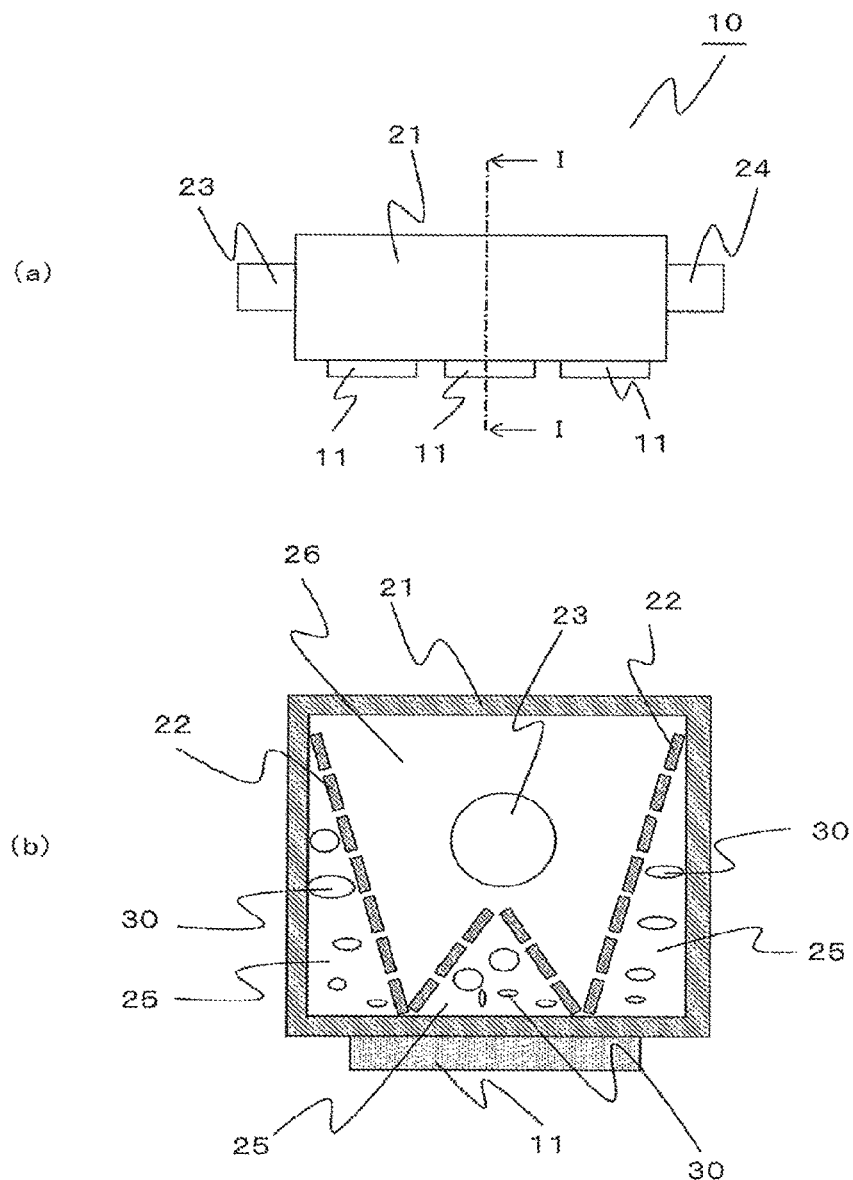
FIG. 13 includes a side view of the power conversion device according to Embodiment 8 of the present invention and a sectional view at position I-I.

FIG. 13 includes a side view of the power conversion device 10 according to Embodiment 8 of the present invention, and a sectional view at position I-I. FIG. 13(a) is a side view of the power conversion device 10 and shows position I-I, and FIG. 13(b) is a sectional view at position I-I. Note that, in the modification of the shape of the opening body 22 shown in FIG. 13, similarly to the opening body 22 shown in Embodiment 1, the opening body 22 is provided in the refrigerant flow path to extend in the axial direction and divides the refrigerant flow path. As shown in FIG. 13(b), the I-I cross section is a vertical section, and the opening body 22 has a W-shaped section. The ends of the opening body 22 are fixed to the upper two corners of the four corners of the housing 21 of the cooling device 20 and two parts of the opening body 22 are fixed to two parts on the bottom of the housing 21. In Embodiment 8 of the present invention, the first area 25 is divided into three areas by the opening body 22.

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 9

The cooling system 1, the power conversion device 10, and the cooling device 20 according to Embodiment 9 of the present invention will be described with reference to FIGS. 14 and 15. Note that, in the cooling system 1, the power conversion device 10, and the cooling device 20 according to Embodiment 1, a configuration in which the electronic devices 11 that generate heat are provided on the outside of the housing 21 at the bottom surface of the cooling device 20 has been described. In Embodiment 9 of the present invention, a configuration in which the electronic devices 11 that generate heat are provided not only on the outside of the housing 21 at the bottom surface of the cooling device 20, but also on the outside of the housing 21 at the side surfaces of the cooling device 20 will be described. Hereinbelow, the difference from Embodiment 1 will be mainly described, and descriptions of the same or corresponding parts will be omitted.

Figure 14:
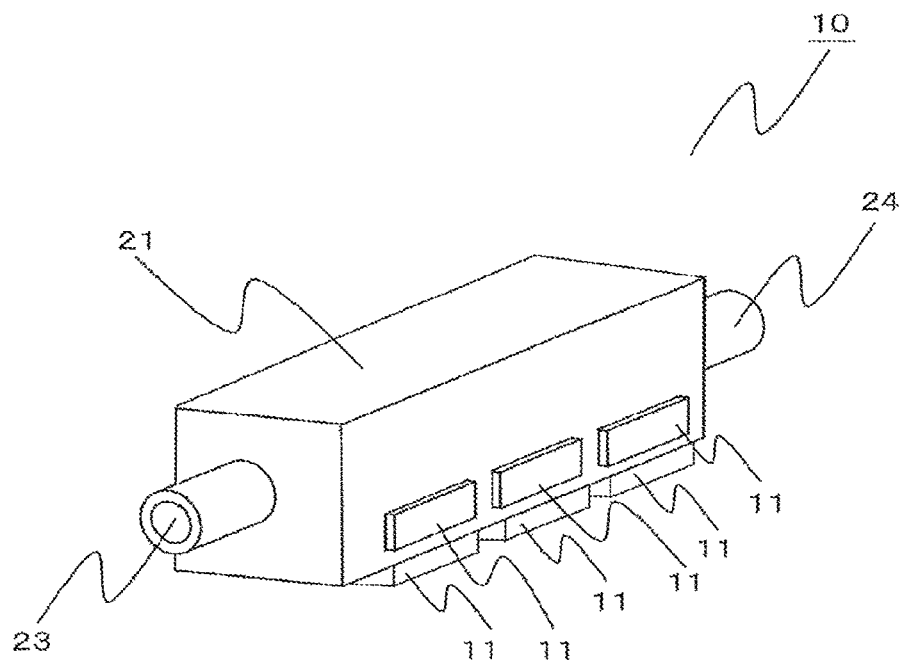
FIG. 14 is an external perspective view of the power conversion device according to Embodiment 9 of the present invention.
Figure 15:
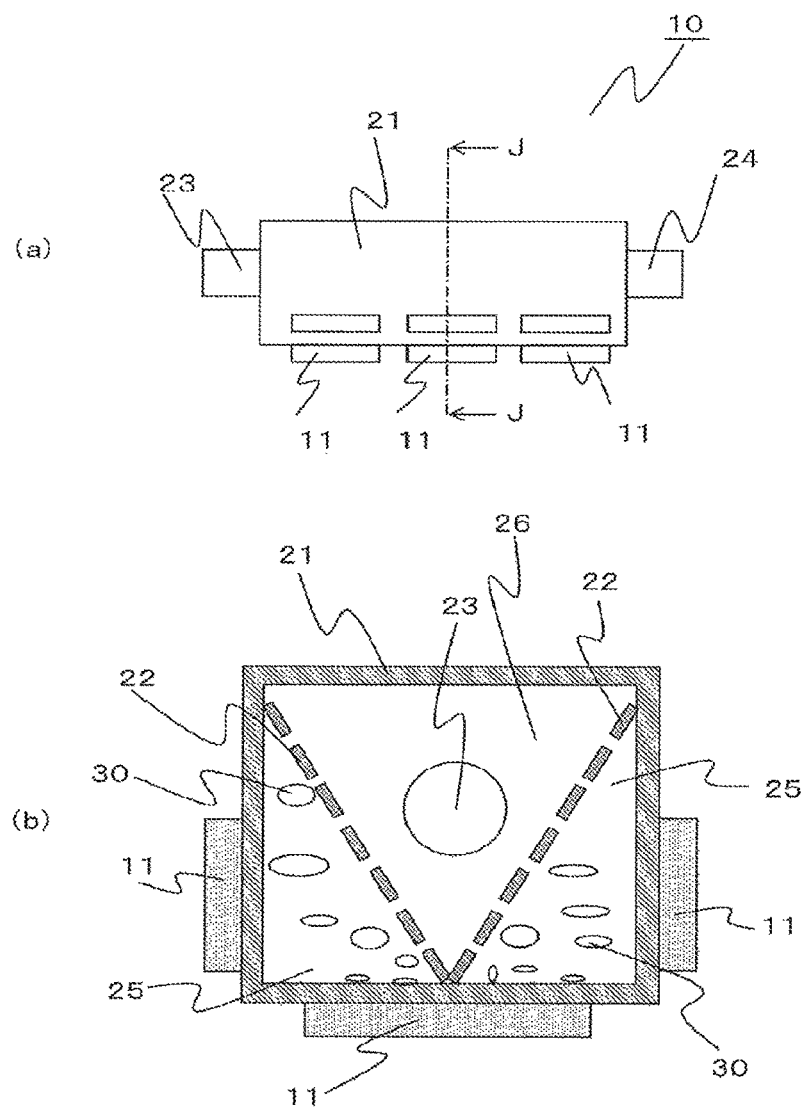
FIG. 15 includes a side view of the power conversion device according to Embodiment 9 of the present invention and a sectional view at position J-J.

FIG. 14 is an external perspective view of the power conversion device 10 according to Embodiment 9 of the present invention. As shown in FIG. 14, the power conversion device 10 according to Embodiment 9 of the present invention includes the electronic devices 11 and the cooling device 20, and the electronic devices 11 are provided not only on the outside of the housing 21 at the bottom surface of the cooling device 20, but also on the outside of the housing 21 at the side surfaces of the cooling device 20. Hence, the power conversion device 10 according to Embodiment 9 of the present invention has heating surfaces not only at the bottom surface of the housing 21 of the cooling device 20, but also at the side surfaces of the housing 21 of the cooling device 20. FIG. 15 includes a side view of the power conversion device 10 according to Embodiment 9 of the present invention, and a sectional view at position J-J. FIG. 15(a) shows position J-J in the side view of the power conversion device 10. FIG. 15(b) is a sectional view of the power conversion device 10 at position J-J.

The opening body 22 shown in FIG. 15(b) has a V-shaped section. The ends of the opening body 22 are fixed to the upper two corners of the four corners of the housing 21 of the cooling device 20, and furthermore, a part of the opening body 22 is fixed to a portion in the vicinity of the center of the bottom surface of the housing 21 of the cooling device 20. In Embodiment 9 of the present invention, the refrigerant flow path is divided into three areas by the opening body 22, and each area has a triangular sectional shape. The power conversion device 10 according to Embodiment 9 of the present invention has heating surfaces not only at the bottom surface of the housing 21 of the cooling device 20, but also at the side surfaces of the housing 21 of the cooling device 20, and, in the refrigerant flow path that is divided into three areas, two areas serve as the first area 25 including the heating surfaces that heat the refrigerant. The remaining one area is the second area 26 including the refrigerant inlet 23 and the refrigerant outlet 24. In other words, the first area 25 is divided into a plurality of areas by the opening body 22.

The refrigerant in the cooling device 20 is heated to boil by the electronic devices 11 provided on the outside of the housing 21 at the bottom surface of the cooling device 20 and on the outside of the housing 21 at the side surfaces of the cooling device 20 and then produces the bubbles 30. As a result, in the first area 25, the bubbles 30 are produced mainly from the heating surfaces, which heat the refrigerant, and are separated from the heating surfaces. Although the separated bubbles 30 rise by buoyancy, the opening body 22 can inhibit the bubbles 30 from passing through the openings 22b and reaching the pump 3 via the refrigerant outlet 24. Note that, because the bubbles 30 produced by boiling rise by the buoyancy, it is preferable that the electronic devices 11 be provided at as low positions as possible on the outside surfaces of the housing 21 of the cooling device 20

With this configuration, the bubbles 30 produced as a result of the refrigerant receiving heat from the electronic devices 11 that generate heat, provided at the lower part of the housing 21, and boiling can be inhibited from flowing from the first area 25 to the second area 26 by the opening body 22. Furthermore, compared with an opening body 22 that has a rectangular section, the weight of the opening body 22 can be reduced, and thus, the weight and cost of the power conversion device 10 can be reduced.

Embodiment 10

The cooling system 1, the power conversion device 10, and the cooling device 20 according to Embodiment 10 of the present invention will be described with reference to FIG. 16. Note that, in Embodiment 10 of the present invention, in the cooling system 1, the power conversion device 10, and the cooling device 20 according to Embodiment 1, a modification in which cavities 32 are provided in the heating surface of the cooling device 20 will be described. Hereinbelow, the difference from Embodiment 1 will be mainly described, and descriptions of the same or corresponding parts will be omitted.

Figure 16:
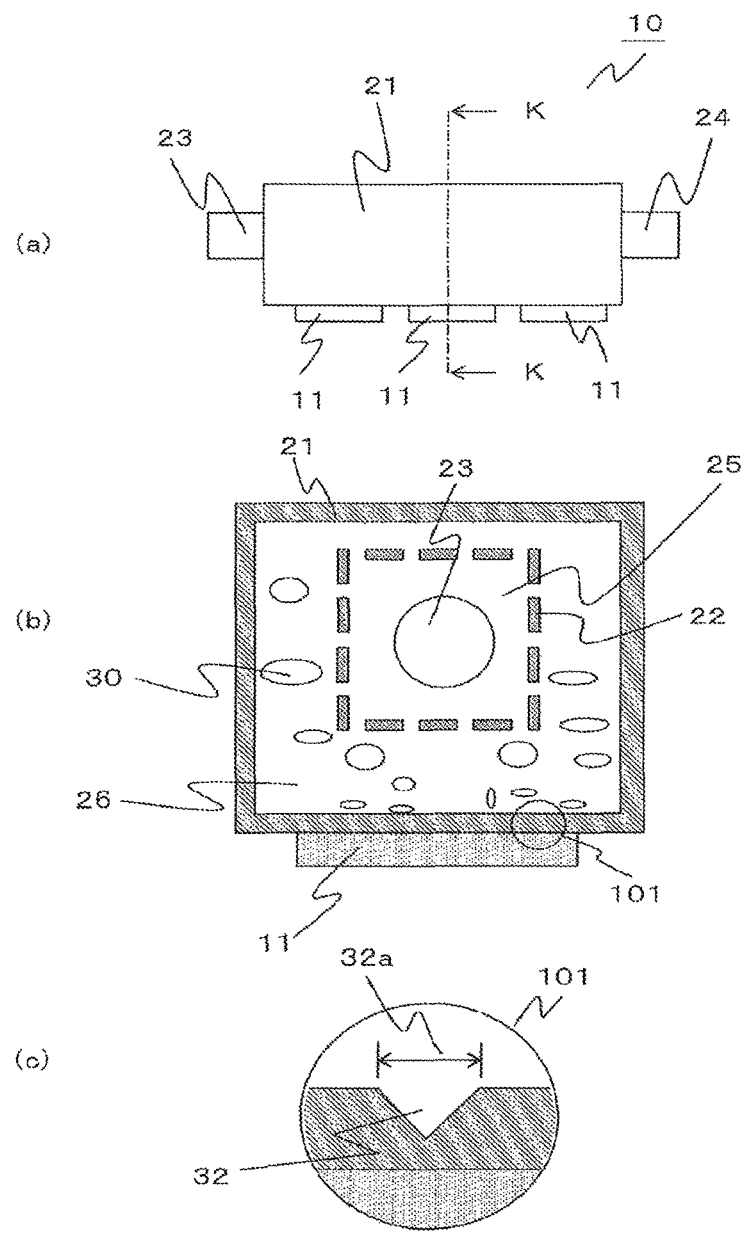
FIG. 16 includes a side view of the power conversion device according to Embodiment 10 of the present invention, a sectional view at position K-K, and an enlarged view.

FIG. 16 includes a side view of the power conversion device 10 according to Embodiment 10 of the present invention, a sectional view at position K-K, and an enlarged view. FIG. 16(a) shows position K-K in the side view of the power conversion device 10. FIG. 16(b) is a sectional view of the power conversion device 10 at position K-K. Furthermore, FIG. 16(c) is an enlarged view of an enlarged part 101 in the power conversion device 10. As shown in FIG. 16(b), the cross section at position K-K is a vertical section, and the cavities 32 are provided in the heating surface inside the housing 21, on which the electronic devices 11 are provided. The cavities 32 are fine scratches or depressions provided in the heat-transfer surface and are formed by oxidation treatment, metal firing, thermal spraying, sandblast processing, providing grooves by a cutting tool, cutting-and-raising, or other processing. FIG. 16(c) is an enlarged view of the cavity 32. The cavities 32 in the heating surface inside the housing 21 preferably have a width 32a of 10 to 1,000 µm. Note that the shape of the cavities 32 is not limited to a triangular shape, as shown in FIG. 16(c), and may be any shape, as long as the bubbles can be retained.

With this configuration, the bubbles 30 caught in the cavities 32 serve as nuclei and facilitate the formation of the bubbles 30 by boiling. As a result, the frequency of formation of bubbles 30 is increased, and thus, the cooling performance of the cooling device 20 can be improved.

Embodiment 11

The cooling system 1, the power conversion device 10, and the cooling device 20 according to Embodiment 11 of the present invention will be described with reference to FIG. 17. Note that, in Embodiment 11 of the present invention, in the cooling system 1, the power conversion device 10, and the cooling device 20 according to Embodiment 1, a modification in which fins 33 are provided in the heating surface of the cooling device 20 will be described. Hereinbelow, the difference from Embodiment 1 will be mainly described, and descriptions of the same or corresponding parts will be omitted.

Figure 17:
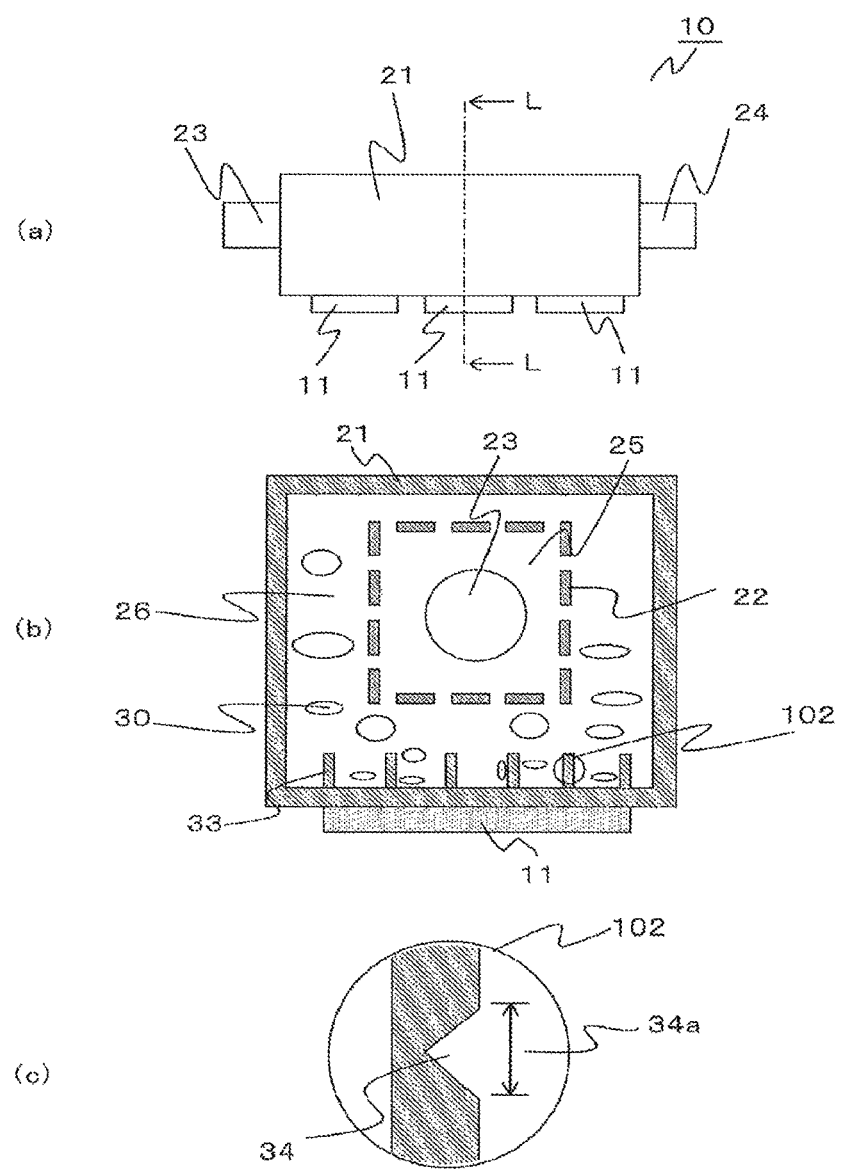
FIG. 17 includes a side view of the power conversion device according to Embodiment 11 of the present invention, a sectional view at position L-L, and an enlarged view.

FIG. 17 includes a side view of the power conversion device 10 according to Embodiment 11 of the present invention, a sectional view at position L-L, and an enlarged view. FIG. 17(a) shows position L-L in the side view of the power conversion device 10. FIG. 17(b) is a sectional view of the power conversion device 10 at position L-L. Furthermore, FIG. 17(c) is an enlarged view of an enlarged part 102 in the power conversion device 10. As shown in FIG. 17(b), the cross section at position L-L is a vertical section, and the fins 33 are provided on the heating surface of the housing 21, on which the electronic devices 11 are provided. The fins 33 extend to the inner side of the cooling device 20. Furthermore, cavities 34 are provided in the surfaces of the fins 33. The cavities 34 are fine scratches or depressions provided in the heat-transfer surfaces and are formed by oxidation treatment, metal firing, thermal spraying, sandblast processing, providing grooves by a cutting tool, cutting-and-raising, or other processing. FIG. 17(c) is an enlarged view of the cavity. The cavities 34 in the surfaces of the fins 33 preferably have a width 34a of 10 to 1,000 µm. Furthermore, the cavities 34 may also be provided in the heating surface inside the housing 21.

Because the fins 33 extend to the inner side of the cooling device 20 to project, the area of the portion in contact with the refrigerant is increased by the fins 33, and, as a result, the heat exchange capacity increases. The shape of the fins 33 may be triangular fins, pin fins, or other fins. It is also possible to weld the fins 33 formed as separate parts to the heating surface or to form the fins 33 by performing groove processing on the heating surface. Furthermore, the arrangement of the fins 33, the height of the fins 33, the number of fins 33, or other factors may be changed, as appropriate, according to the specifications. Note that the shape of the cavities 34 is not limited to a triangular shape, as shown in FIG. 17(c), and may be any shape, as long as the bubbles can be retained.

With this configuration, the bubbles 30 caught in the cavities 34 serve as nuclei and facilitate the formation of the bubbles 30 by boiling. As a result, the frequency of formation of bubbles 30 is increased, and thus, the cooling performance of the cooling device 20 can be improved. Furthermore, by providing the fins 33, the heat-transfer area is increased. Thus, the amount of heat exchange with the refrigerant is increased, and hence, the cooling performance of the cooling device 20 can be improved even more.

Embodiment 12

The cooling system 1, the power conversion device 10, and the cooling device 20 according to Embodiment 12 of the present invention will be described with reference to FIGS. 18 and 19. Note that, in Embodiment 12 of the present invention, in the cooling system 1, the power conversion device 10, and the cooling device 20 according to Embodiment 1, a modification in which the sectional shape of the housing 21 of the power conversion device 10 is changed to a polygonal shape will be described. Hereinbelow, the difference from Embodiment 1 will be mainly described, and descriptions of the same or corresponding parts will be omitted.

Figure 18:
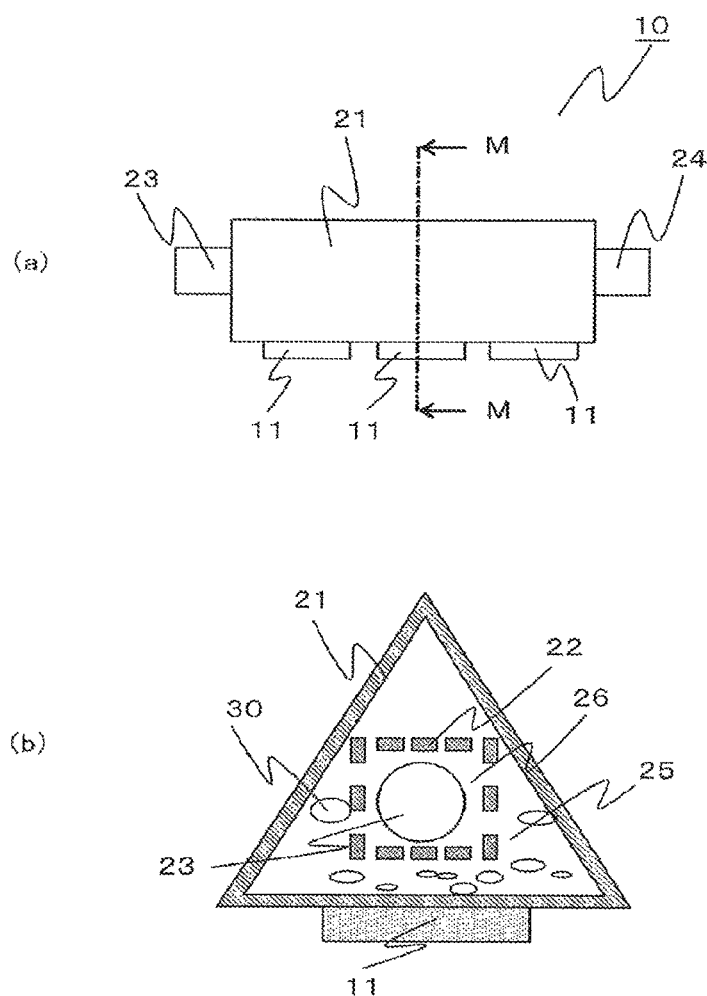
FIG. 18 includes a side view of the power conversion device according to Embodiment 12 of the present invention and a sectional view at position M-M.

FIG. 18 includes a side view of the power conversion device 10 according to Embodiment 12 of the present invention, and a sectional view at position M-M. FIG. 19 includes a side view of the power conversion device 10 according to Embodiment 12 of the present invention, and a sectional view at position N-N. FIGS. 18 and 19 show cases where the housing 21 has a polygonal section, that is, examples in which the housing 21 is a prism having three or more sides.

From FIG. 18, FIG. 18(a) shows position M-M in the side view of the power conversion device 10. FIG. 18(b) is a sectional view of the power conversion device 10 at position M-M. From FIG. 18, the cross section of the housing 21 at position M-M is triangular, and the housing 21 is formed of a triangular prism. The electronic devices 11 that generate heat are provided on the outer bottom surface of the housing 21.

Figure 19:
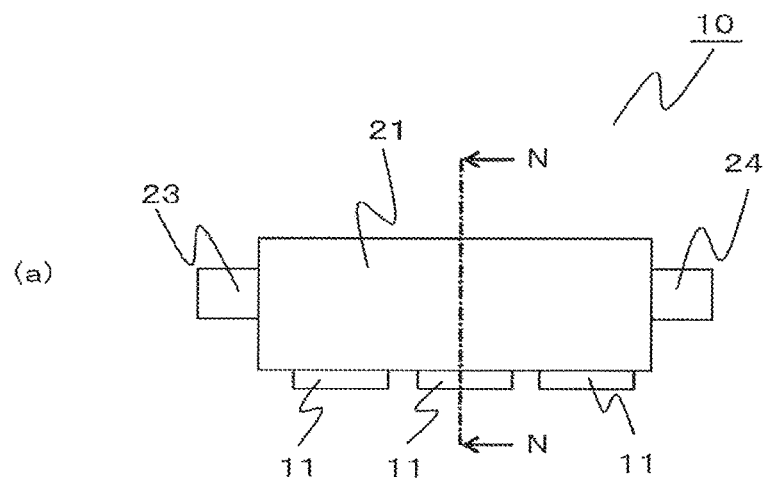
FIG. 19 includes a side view of the power conversion device according to Embodiment 12 of the present invention and a sectional view at position N-N.
Figure 19:
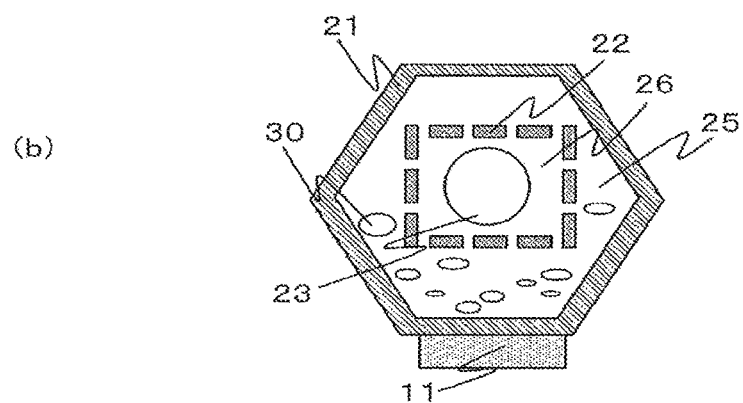

From FIG. 19, FIG. 19(a) shows position N-N in the side view of the power conversion device 10. FIG. 19(b) is a sectional view of the power conversion device 10 at position N-N. From FIG. 19, the cross section of the housing 21 at position N-N is hexagonal, and the housing 21 is formed of a hexagonal prism. The electronic devices 11 that generate heat are provided on the outer bottom surface of the housing 21.

The cooling device 20 in Embodiment 12 of the present invention is characterized in that the housing 21 has a polygonal vertical section. This configuration increases the freedom of layout of the electronic devices 11 when the electronic devices 11 are provided on the housing 21.

Embodiment 13

The cooling system 1, the power conversion device 10, and the cooling device 20 according to Embodiment 13 of the present invention will be described with reference to FIG. 20. Note that, in Embodiment 13 of the present invention, in the cooling system 1, the power conversion device 10, and the cooling device 20 according to Embodiment 1, a modification in which the sectional shape of the housing 21 of the power conversion device 10 is changed to a circular shape will be described. Hereinbelow, the difference from Embodiment 1 will be mainly described, and descriptions of the same or corresponding parts will be omitted where appropriate.

Figure 20:
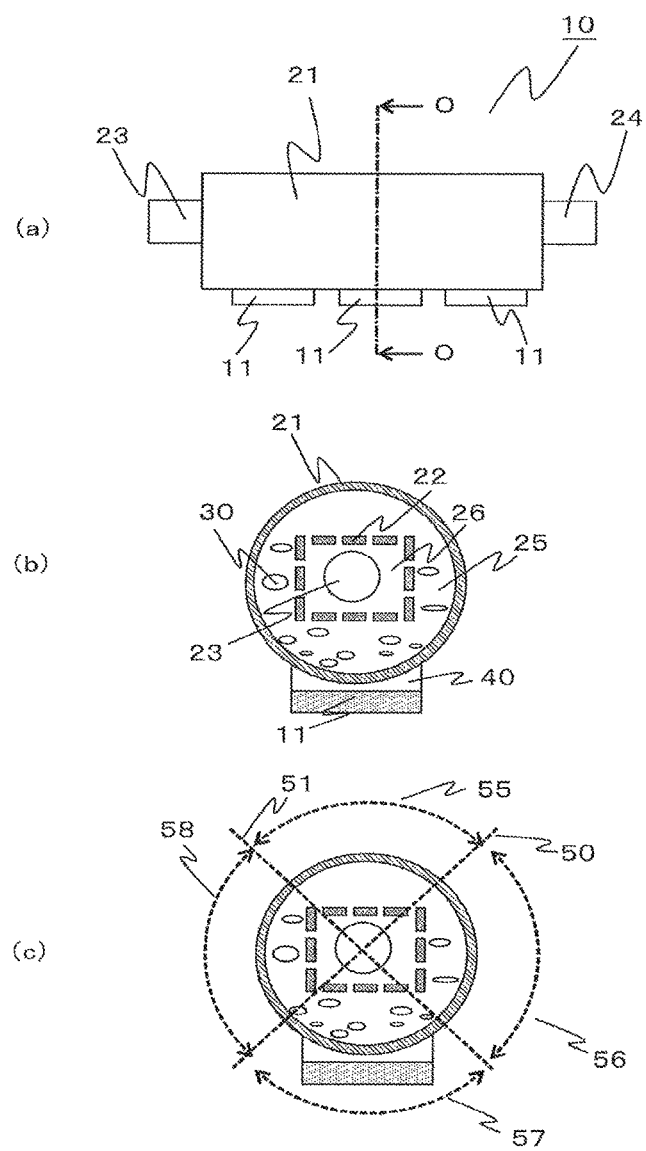
FIG. 20 includes a side view of the power conversion device according to Embodiment 13 of the present invention and sectional views at position O-O.

FIG. 20 includes a side view of the power conversion device 10 according to Embodiment 13 of the present invention, and sectional views at position O-O. FIG. 20 shows a case where the cross section of the housing 21 is circular, that is, an example in which the housing 21 is a cylinder. FIG. 20(a) shows position O-O in the side view of the power conversion device 10. FIG. 20(b) is a sectional view of the power conversion device 10 at position O-O, and FIG. 20(c) is a diagram in which auxiliary axes 50 and 51, and auxiliary lines 55, 56, 57, and 58 are provided to section the housing 21 in FIG. 20(b) for convenience.

From FIG. 20(b), the cross section of the housing 21 at position O-O is circular, and the housing 21 is formed of a cylinder. Furthermore, the auxiliary axis 50 and the auxiliary axis 51 shown FIG. 20(c) divide the circular cross section of the housing 21 shown in FIG. 20(b) into four equal parts. The auxiliary axis 50 is an axis rotated clockwise by 45 degrees from the vertical direction, and the auxiliary axis 51 is an axis rotated counterclockwise by 45 degrees from the vertical direction. Furthermore, the circular cross section of the housing 21 divided into four equal parts by the auxiliary axes 50 and 51 is sectioned into areas indicated by the auxiliary line 55, the auxiliary line 56, the auxiliary line 57, and the auxiliary line 58, clockwise from above.

In Embodiment 13 of the present invention, when the power conversion device 10 including the housing 21, which is formed of a cylinder, is installed in a vehicle or other place, an upper surface in the vertical direction, indicated by the auxiliary line 55, is assumed to be the top surface, a lower surface indicated by the auxiliary line 57 is assumed to be the bottom surface, and surfaces indicated by the auxiliary line 56 and the auxiliary line 58 are assumed to be the side surfaces.

More specifically, in a case where the top part of the circular cross section of the housing 21 is a base position, the bottom surface of the housing 21, which is formed of a cylinder, is a surface in the range starting at a position, in the circular section, 135 degrees clockwise from the base position and ending at a position 225 degrees. Similarly, the top surface of the housing 21, which is formed of a cylinder, is a surface in the range starting at a position, in the circular section, 45 degrees counterclockwise from the base position and ending at a position 45 degrees clockwise from the base position. Furthermore, the side surfaces of the housing 21, which is formed of a cylinder, are a surface in the range starting at a position, in the circular section, 45 degrees clockwise from the base position and ending at a position 135 degrees clockwise from the base position, and a surface in the range starting at a position, in the circular section, 225 degrees clockwise from the base position and ending at a position 315 degrees clockwise from the base position.

Furthermore, the electronic devices 11 that generate heat are provided on the outer bottom surface of the housing 21 with a thermal conduction sheet 40 between the electronic devices 11 and the housing 21. The thermal conduction sheet 40 is used to improve the contact between the electronic devices 11 that generate heat and the housing 21 and is formed of a flexible material, such as silicon. With this configuration, the housing 21 can be appropriately brought into contact with the electronic devices 11 even when the cross section of the housing 21 is circular. Note that the use of the thermal conduction sheet 40 is not limited to the example in FIG. 20, and is also possible when an improvement in the contact between the electronic devices 11 and the housing 21 is desired.

As has been described above, the cooling system 1 according to Embodiment 13 of the present invention is the cooling system 1 that performs cooling by circulating refrigerant and includes the refrigerant pipes 2 through which the refrigerant flows, the pump 3 that is connected to the refrigerant pipes 2 and circulates the refrigerant in the refrigerant pipes 2, the radiator 4 that is connected to the refrigerant pipes 2 and rejects the heat of the refrigerant circulated by the pump to the outside, and the power conversion device 10 that is connected to the refrigerant pipes 2 and is cooled by the refrigerant circulated by the pump. The power conversion device 10 includes the housing 21 that is a cylinder having a hollow interior, the cylinder having the refrigerant inlet 23 from which the refrigerant flows in and the refrigerant outlet 24 from which the refrigerant flows out, and has, in the hollow interior of the cylinder, the refrigerant flow path through which the refrigerant flows, the electronic devices 11 that are provided on at least one of the outer bottom surface and the outer side surfaces of the housing 21 and heat the refrigerant in the housing 21, and the opening body 22 that is provided in the housing 21, divides the refrigerant flow path into the first area 25 including the heating surface of the housing 21, on which the electronic devices 11 are provided, and the second area 26 including the refrigerant inlet 23 and the refrigerant outlet 24, and has the plurality of openings 22b that inhibit the bubbles 30 produced in the first area 25 from moving to the second area 26.

Furthermore, the power conversion device 10 according to Embodiment 13 of the present invention includes the housing 21 that is a cylinder having a hollow interior, the cylinder having the refrigerant inlet 23 from which the refrigerant flows in and the refrigerant outlet 24 from which the refrigerant flows out, and has, in the hollow interior of the cylinder, the refrigerant flow path through which the refrigerant flows, the electronic devices 11 that are provided on at least one of the outer bottom surface and the outer side surfaces of the housing 21 and heat the refrigerant in the housing 21, and the opening body 22 that is provided in the housing 21, divides the refrigerant flow path into the first area 25 including the heating surface of the housing 21, on which the electronic devices 11 are provided, and the second area 26 including the refrigerant inlet 23 and the refrigerant outlet 24, and has a plurality of openings 22b that inhibit the bubbles 30 produced in the first area 25 from moving to the second area 26.

Furthermore, the cooling device 20 according to Embodiment 13 of the present invention includes the housing 21 that is a cylinder having a hollow interior, the cylinder having the refrigerant inlet 23 from which the refrigerant flows in and the refrigerant outlet 24 from which the refrigerant flows out, and has, in the hollow interior of the cylinder, the refrigerant flow path through which the refrigerant flows, and the opening body 22 that is provided in the housing 21, divides the refrigerant flow path into the first area 25 including the heating surface that is at least one of the bottom surface and side surfaces of the housing 21 and heats the refrigerant, and the second area 26 including the refrigerant inlet 23 and the refrigerant outlet 24, and has a plurality of openings 22b that inhibit the bubbles 30 produced in the first area 25 from moving to the second area 26.

The cooling device 20 in Embodiment 13 of the present invention is characterized in that the housing 21 has a circular vertical section. This configuration increases the freedom of layout of the electronic devices 11 when the electronic devices 11 are provided on the housing 21.

Furthermore, because the opening body 22 divides the refrigerant flow path in the cooling device 20 into the first area 25 including the heating surface and the second area 26 including the refrigerant inlet 23 and the refrigerant outlet 24, the bubbles 30 produced by boiling in the first area 25 can be inhibited from flowing into the second area 26, and thus to inhibit the bubbles 30 from flowing out of the cooling device 20. Consequently, the bubbles 30 produced by boiling in the cooling device 20 can be inhibited from flowing into the pump 3, and thus to prevent cavitation caused by the condensation of the bubbles 30 in the pump 3. Furthermore, it is possible to obtain the cooling device 20, the power conversion device 10, and the cooling system 1 in which the bubbles 30 produced by boiling in the cooling device 20 can be inhibited from flowing out of the cooling device 20, and thus to prevent vibration, noise, and damage to the pipes and other components.

Furthermore, by providing, on the housing 21, the frame to which the opening body 22 is attached, replacement of the opening body 22, attachment of a plurality of opening bodies 22 in a stack state, and other task becomes easy. Hence, in response to a specification change, such as when the refrigerant is changed, and when the electronic devices 11 are changed, leading to a change in the amount of heat generated by the electronic devices 11, the opening diameter, the aperture ratio, and other factors of the opening body 22 can be easily adjusted. With this configuration, it is possible to adjust, as appropriate, the flow rate of refrigerant flowing between the first area 25 and the second area 26 and other factors, and thus to improve the efficiency of cooling the electronic devices 11 that generate heat.

The electronic devices 11 that generate heat are cooled by using a boiling phenomenon. Typically, in cooling of the electronic devices 11, because the heat transfer coefficient increases with an increase in the flow rate of the refrigerant flowing in from the refrigerant inlet 23, the efficiency of cooling the electronic devices 11 is improved. Meanwhile, because the electronic devices 11 are cooled by using a boiling phenomenon, the flow rate of the refrigerant flowing in from the refrigerant inlet 23 has almost no effect on the efficiency of cooling the electronic devices 11. Hence, even when the flow rate of the refrigerant flowing in is reduced by increasing the opening diameter of the refrigerant inlet 23 without changing the flow rate of refrigerant flowing in, the efficiency of cooling the electronic devices 11 is not affected. Hence, even when the vertical cross section of the refrigerant flow path is made larger than the vertical inflow cross section of the refrigerant inlet 23, the pressure loss in the cooling device 20 can be reduced without affecting the cooling efficiency, a high pressure-boosting capability of the pump 3 becomes unnecessary, and thus, the output of the pump 3 can be reduced. Consequently, the pump 3 can be made compact, and thus, the weight, size, and cost of the cooling system 1 can be reduced.

Note that, in the present invention, within the scope of the invention, the embodiments may be freely combined, or the embodiments may be modified or omitted as appropriate.

REFERENCE SIGNS LIST 1 cooling system 2 refrigerant pipe 3 pump 4 radiator 10 power conversion device 11 electronic device 21 housing 22 opening body 23 refrigerant inlet 24 refrigerant outlet 25 first area 26 second area

The invention claimed is:

1. A cooling device comprising:
a housing having a hollow interior, the housing having a refrigerant inlet from which refrigerant flows in and a refrigerant outlet from which the refrigerant flows out, and having, in the hollow interior of the housing, a refrigerant flow path through which the refrigerant flows; and
an opening body provided in the housing, the opening body dividing the refrigerant flow path into a first area including a heating surface being at least one of a bottom surface and side surfaces of the housing and heating the refrigerant, and a second area including the refrigerant inlet and the refrigerant outlet, the opening body having a plurality of openings inhibiting bubbles produced in the first area from moving to the second area, wherein the opening body includes a plurality of side surfaces that divide the flow path into the first area and the second area, wherein a plurality of the side surfaces include the plurality of openings, and wherein the first area surrounds an entirety of a perimeter of the second area.

2. The cooling device of claim 1, wherein an opening diameter of the plurality of openings in the opening body is 0.1 to 3.0 mm.

3. The cooling device of claim 1, wherein an opening diameter of the plurality of openings in the opening body is smaller than a diameter d [m] of the bubbles calculated by an expression of $d=0.0209\phi\sqrt{(\sigma/(g(\rho l-\rho v)))}$, where $\phi$ [degrees] is a contact angle when the bubbles leave the bottom surface or the side surfaces, $\sigma$ [N/m] is a surface tension of the refrigerant, g [m$^2$/s] is a gravitational acceleration, $\rho l$ [kg/m$^3$] is a density of liquid refrigerant, and $\rho v$ [kg/m$^3$] is a density of saturated vapor of the refrigerant.

4. The cooling device of claim 1, wherein the opening body includes two or more opening members stacked on one another.

5. The cooling device of claim 1, wherein the opening body has a V-shaped or a W-shaped vertical section.

6. The cooling device of claim 1, wherein the housing has fins on the heating surface inside the housing.

7. The cooling device of claim 6, wherein the fins have cavities.

8. The cooling device of claim 1, wherein the housing has cavities in the heating surface inside the housing.

9. The cooling device of claim 1, wherein, in the refrigerant flow path, a vertical cross section of the refrigerant flow path is larger than a vertical inflow cross section of the refrigerant inlet.

10. A power conversion device comprising:

the cooling device of claim 1; and an electronic device provided on at least one of an outer bottom surface and outer side surfaces of the housing of the cooling device and heating the refrigerant inside the housing.

11. A cooling system performing cooling by circulating refrigerant, the cooling system comprising:

refrigerant pipes through which the refrigerant flows;

a pump connected to the refrigerant pipes and circulating the refrigerant inside the refrigerant pipes;

a radiator connected to the refrigerant pipes and rejecting heat of the refrigerant circulated by the pump to an outside; and the power conversion device of claim 10 connected to the refrigerant pipes and cooled by the refrigerant circulated by the pump.

12. The cooling device of claim 1, wherein the opening body is a wire mesh.

13. The cooling device of claim 1, wherein an opening body is a punched metal sheet.

* * * * *